United States Patent
Shimazaki et al.

(10) Patent No.: US 6,831,483 B2
(45) Date of Patent: Dec. 14, 2004

(54) SEMICONDUCTOR INTEGRATED CIRCUIT HAVING HIGH-SPEED AND LOW-POWER LOGIC GATES WITH COMMON TRANSISTOR SUBSTRATE POTENTIALS, AND DESIGN DATA RECORDING MEDIUM THEREFOR

(75) Inventors: Yasuhisa Shimazaki, Richmond, CA (US); Motoi Ichihashi, Tachikawa (JP)

(73) Assignee: Renesas Technology Corp., Tokyo (JP)

( * ) Notice: Subject to any disclaimer, the term of this patent is extended or adjusted under 35 U.S.C. 154(b) by 0 days.

(21) Appl. No.: 09/855,660

(22) Filed: May 16, 2001

(65) Prior Publication Data

US 2001/0043085 A1 Nov. 22, 2001

(30) Foreign Application Priority Data

May 19, 2000 (JP) .................................. 2000-152732

(51) Int. Cl.⁷ ............................................... H03K 19/20
(52) U.S. Cl. ........................ 326/121; 326/27; 326/81; 326/31; 327/534
(58) Field of Search .............................. 326/26, 27, 31, 326/34, 81, 121; 327/534

(56) References Cited

U.S. PATENT DOCUMENTS

| | | | |
|---|---|---|---|
| 5,266,848 A | 11/1993 | Nakagome et al. ......... 307/475 |
| 5,583,457 A | * 12/1996 | Horiguchi et al. ........... 326/121 |
| 5,614,847 A | 3/1997 | Kawahara et al. ............ 326/98 |
| 6,097,043 A | 8/2000 | Igarashi et al. .............. 257/207 |
| 6,242,948 B1 | * 6/2001 | Makino ....................... 326/81 |
| 6,380,764 B1 | 4/2002 | Katoh et al. ................... 326/93 |

FOREIGN PATENT DOCUMENTS

| JP | 01-273332 | 11/1989 |
|---|---|---|
| JP | 02-084815 | 3/1990 |
| JP | 04-132252 | 5/1992 |
| JP | 04-137653 | 5/1992 |
| JP | 4-155863 | 5/1992 |
| JP | 04-211515 | 8/1992 |
| JP | 05-108194 | 4/1993 |
| JP | 05-299624 | 11/1993 |
| JP | 06-204437 | 7/1994 |
| JP | 07-050392 | 2/1995 |
| JP | 10-74843 | 3/1998 |
| JP | 11-195976 | 7/1999 |
| JP | 11-224901 | 8/1999 |

* cited by examiner

*Primary Examiner*—Daniel Chang
(74) *Attorney, Agent, or Firm*—Miles & Stockbridge P.C.

(57) ABSTRACT

Disclosed is a semiconductor integrated circuit realizing improved operating speed, reduced power consumption in an active mode, reduced power consumption in a standby mode, and reduced area of a chip. A first logic gate using a first pair of potentials VDDL, VSSL having a relatively small potential difference as an operation power source and a second logic gate using a second pair of potentials VDDH, VSSH having a relatively large potential difference as an operation power source commonly use substrate potentials VBP, VBN of MIS transistors. The second logic gate has a relatively high driving capability, and the first logic gate can operate on relatively low power. The MIS transistor has a threshold voltage which increases by a reverse substrate bias and decreases by a forward substrate bias. By commonly using the substrate potential, even in the case where different substrate bias states are generated at both of the logic gates, MOS transistors of the logic gates can be formed in the common well region.

47 Claims, 22 Drawing Sheets

[INCREASE IN THRESHOLD VOLTAGE BY APPLICATION OF SUBSTRATE BIAS]

[DECREASE IN LEAK CURRENT BY INCREASE IN THRESHOLD VOLTAGE]

OPERATION WAVEFORM OF CRITICAL PATH

OPERATION WAVEFORM OF NON-CRITICAL PATH

[CASE USING ONLY LOW POWER CELLS]

[CASE USING HIGH SPEED CELL FOR CRITICAL PATH]

FIG. 10(A)
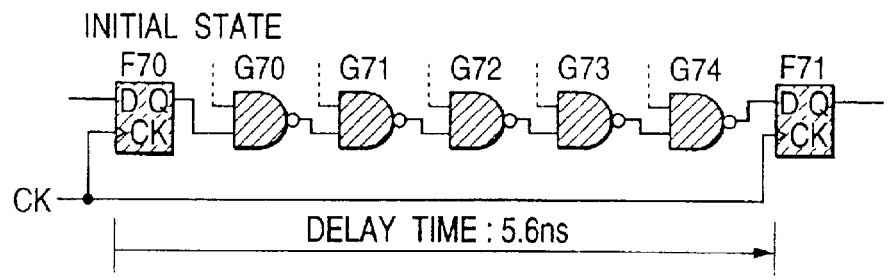
FIG. 10(B)
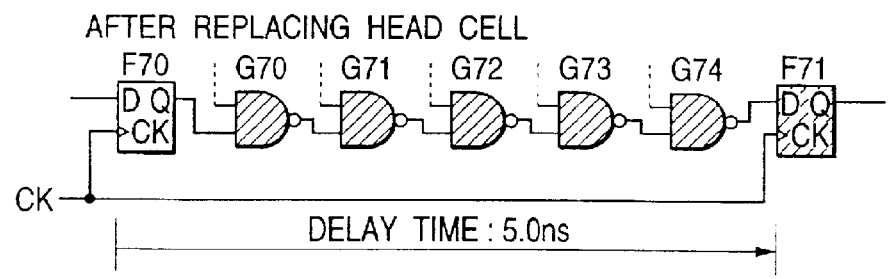
FIG. 10(C)
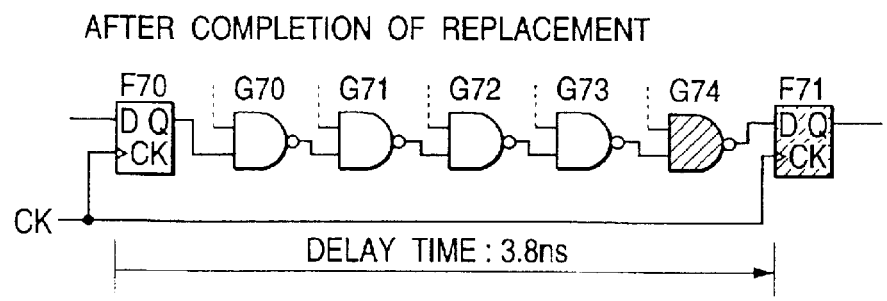
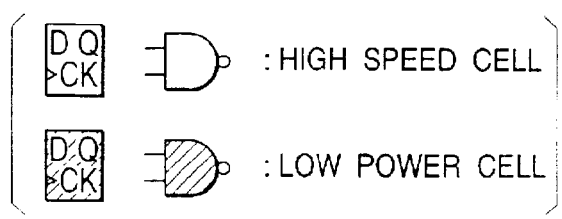

[FLIP FLOP WITH LEVEL SHIFTING FUNCTION]

FIG. 15(A)
INITIAL STATE
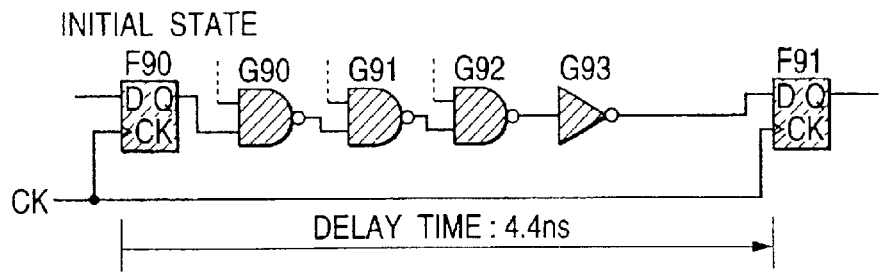
FIG. 15(B)
AFTER REPLACING ONE CELL
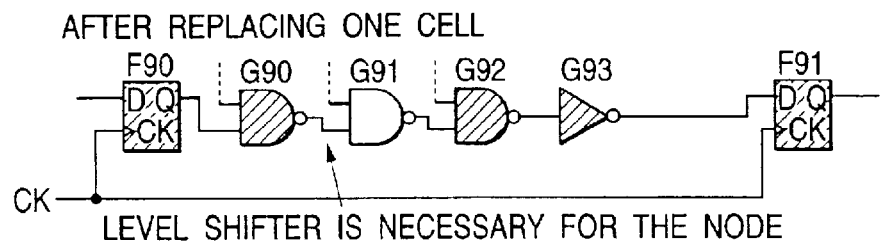
FIG. 15(C)
AFTER INSERTION OF LEVEL SHIFTER
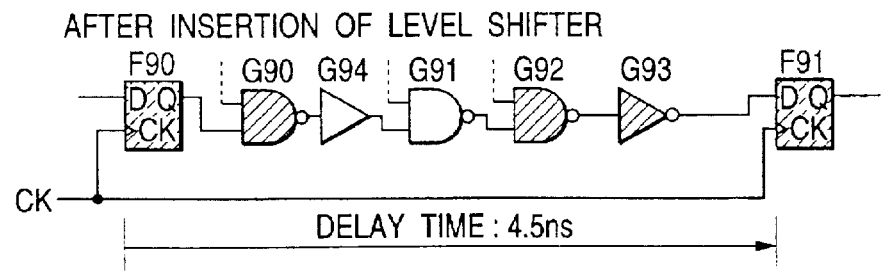
FIG. 15(D)
AFTER COMPLETION OF REPLACEMENT
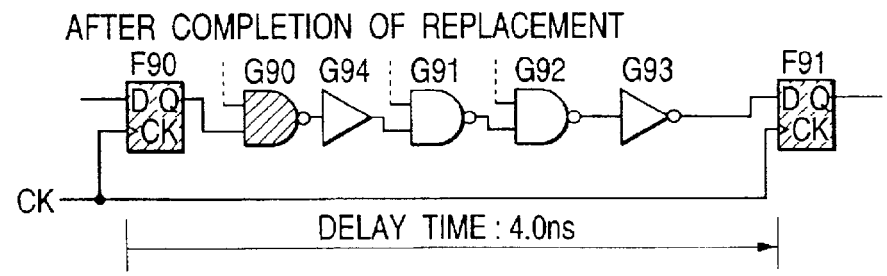
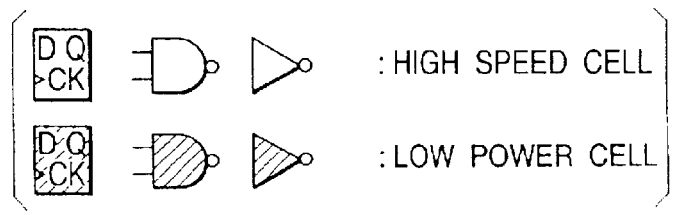

[HIGH SPEED CELL]

[LOW POWER CELL]

[POWER CONNECTION OF CIRCUIT]

[POWER POTENTIAL RELATION]

SEMICONDUCTOR INTEGRATED CIRCUIT HAVING HIGH-SPEED AND LOW-POWER LOGIC GATES WITH COMMON TRANSISTOR SUBSTRATE POTENTIALS, AND DESIGN DATA RECORDING MEDIUM THEREFOR

BACKGROUND OF THE INVENTION

The present invention relates to a semiconductor integrated circuit, a method of designing the same, a program recording medium on which a program for supporting designing of the semiconductor integrated circuit is recorded, and a design data recording medium on which design data used for designing the semiconductor integrated circuit is recorded. More particularly, the invention relates to a technique effective for use in a semiconductor integrated circuit suitable for high-speed and low-power operation.

In recent years, a semiconductor integrated circuit device is requested to have improved operating frequency and lower power consumption. In order to improve the operating frequency, generally, the threshold voltage of an insulated gate field effect transistor (hereinbelow, simply called an MIS (Metal Insulated Semiconductor) transistor or a MOS (Metal Oxide Semiconductor) transistor) used in a semiconductor integrated circuit is decreased. When the threshold voltage is set to too low, however, a MOS transistor cannot be completely turned off due to a subthreshold characteristic of the MOS transistor, a subthreshold leak current increases, and a problem such that power consumption of the semiconductor integrated circuit becomes very high occurs. For solving the problem, Japanese Unexamined Patent Publication No. Hei 11(1999)-195976 (first literature) discloses a method of preparing a plurality of kinds of MOS transistors having different threshold voltages and selectively using the MOS transistors in accordance with the degree of timing allowance of a signal path in a semiconductor integrated circuit.

To address the request for reduction in power consumption, Japanese Unexamined Patent Publication No. Hei 10(1998)-189749 (U.S. Pat. No. 6,097,043) (second literature) discloses a method of preparing a plurality of power supply voltages and selectively using a circuit for supplying a high voltage and a circuit for supplying a low voltage, thereby reducing the power.

The method disclosed in the first literature intends to achieve both improvement in operating speed and reduction in leak current in the standby mode by applying a circuit using a MOS transistor of a low threshold voltage to a path having no timing allowance (critical path) and applying a circuit using a MOS transistor having a high threshold voltage to other paths. In a circuit to which the technique is applied, however, when an attempt is made to reduce the power consumption in active operation by decreasing the power supply voltage, the threshold voltage of a MOS transistor has to be also decreased to maintain the operating speed. It was clarified by the examination of the inventors of the present invention that large reduction in power consumption cannot be expected due to the power consumption increased by the leak current in the standby mode.

According to the method disclosed in the second literature, a plurality of power supply voltages are prepared in a semiconductor integrated circuit. By supplying a high voltage to a circuit as a component of a path having no allowance (critical path) and supplying a low voltage to a circuit as a component of a path having an allowance in accordance with the degree of timing allowance of a signal path, the method intends to achieve improved operating speed and reduction in power in active operation. Regarding a circuit to which the technique is applied, however, the inventors of the present invention have uncovered that since a substrate voltage in a MOS transistor to which a high operating voltage is supplied and that in a MOS transistor to which a low operating voltage is supplied are different from each other, an isolating region is necessary in the substrate, and the chip area may increase. Since all of MOS transistors have the same threshold voltage, there is the possibility that power consumption increases due to a leak current in the standby mode.

SUMMARY OF THE INVENTION

An object of the invention is to provide a semiconductor integrated circuit realizing high-speed and lower-power operation from the viewpoint of operating power source voltage and substrate bias voltage.

Another object of the invention is to provide a semiconductor integrated circuit without an overhead area, realizing improved operating speed, reduced power consumption in an active mode, and reduced power consumption in a standby mode.

Another object of the invention is to provide a designing method suitable for designing a semiconductor integrated circuit without an overhead area, realizing improved operating speed, reduced power consumption in an active mode, and reduced power consumption in a standby mode. Further another object of the invention is to provide a program recording medium on which a design supporting program suitable for increasing efficiency in designing such a semiconductor integrated circuit is recorded and, further, a design data recording medium on which design data suitable for increasing efficiency in designing such a semiconductor integrated circuit is recorded.

The above and other objects and novel features of the invention will become apparent from the description of the specification and the accompanying drawings.

An embodiment of the invention disclosed in the application will be briefly described as follows.

1. <Sharing of Substrate Potential>

From the viewpoint of sharing a substrate potential by logic gates of different operation power sources, a semiconductor integrated circuit has: a first logic gate (1) using, as an operation power source, a first pair of potentials (VDDL and VSSL or VDDL and VSS) having a relatively small potential difference; and a second logic gate (2) using, as an operation power source, a second pair of potentials (VDDH and VSSH or VDDH and VSS) having a relatively large potential difference. Each of the first and second logic gates has an MIS transistor, and substrate potentials (VBP and VBN, or VDDH and VSSH) of the MIS transistors are commonly used by the first and second logic gates.

Since the second logic gate has a larger potential difference of the operation power source as compared with the first logic gate, an output voltage amplitude by the MIS transistors (MP0 and MN0) of the second logic gate is larger than that of the MIS transistors (MP1 and MN1) of the first logic gate. The second logic gate has a relatively higher driving capability and operates at high speed. Since the power consumption in logic operation is proportional to the square of the output voltage amplitude, the first logic gate 1 can operate with less power. At this time, the MIS transistor has a characteristic such that the threshold voltage increases due to a reverse substrate bias applied across the source and the substrate, and the threshold voltage decreases by a forward substrate bias. Since the substrate potentials of the MIS transistors are commonly used by the first and second logic gates, even in the case of generating different substrate bias states in the first and second logic gates, MOS transistors as components of the logic gates can be formed in the common well region. When the substrate potential of the first logic gate and that of the second logic gate are made different from each other, even the conduction type of the MIS transistors is the same, the well regions have to be electrically isolated from each other, and the chip occupying area enlarges due to the isolation areas. The substrate bias states in the first and second logic gates can be set according to the level of the substrate potential and that of the power source potentials of both of the logic circuits. When the forward substrate bias is applied to an MIS transistor included in the second logic gate intended for high speed operation, the threshold voltage decreases, and the operation can be performed at higher speed. On the other hand, when the reverse substrate bias is applied to an MIS transistor included in the first logic gate intended for low power operation, the threshold voltage increases, the subthreshold leak current at the time of non-conduction decreases, and the low power operation is promoted.

As a first example of the substrate bias states which can be set for the first and second logic gates, when the level (VBP) between the high potential side potentials (VDDH and VDDL) at each of the first and second potential pairs and the level (VBN) between the low potential side potentials (VSSL and VSSH) are used as the substrate potentials, the reverse substrate bias can be applied to the MIS transistor in the first logic gate, and the forward substrate bias can be applied to the MIS transistor in the second logic gate. Thus, the second logic gate intended for high speed operation can operate at higher speed, and the first logic gate intended for low power operation can operate with lower power due to reduction in the subthreshold leak current.

As shown in FIG. 1, by using the substrate bias states for both the p-channel type MIS transistor and the n-channel type MIS transistor included in the first and second logic gates, the maximum effect can be produced.

The subthreshold leak is proportional to the gate width of the MIS transistor. Consequently, in consideration of the fact that the gate width of a p-channel type MIS transistor which is generally inferior from the viewpoint of driving capability or electron conductivity tends to be set wider than that of an n-channel type MIS transistor, as shown in FIG. 27, the low power can be realized even when a reverse substrate bias state is generated only for the p-channel type MIS transistor in the first logic gate intended for low power operation.

When the promotion of the low power operation in the first logic gate is mainly considered, as shown in FIG. 25, it is also possible to apply a reverse substrate bias only to the MIS transistor in the first logic gate, and not to apply the substrate bias to the second logic gate.

2. <Sharing of Well Region>

The viewpoint of sharing the substrate potential may be also grasped from the viewpoint of sharing the well region in the MIS transistor. A semiconductor integrated circuit has: a first logic gate (1) using, as an operation power source, a first pair of potentials (VDDL and VSSL, VDDL and VSS) having a relatively small potential difference; and a second logic gate (2) using, as an operation power source, a second pair of potentials (VDDH and VSSH, VDDH and VSS) having a relatively large potential difference. Each of the first and second logic gates has an MIS transistor, and well regions (NWELL, PWELL) of the MIS transistor in which the first logic is formed and well region (NWELL, PWELL) in which an MIS transistor of the second logic gate is formed are made common every conduction type. According to the potential applied to the well region in the MIS transistor, the bias state of the MIS transistor is determined. The action at this time is the same as the above 1.

3. <Viewpoint of Potential Pair>

In a further detailed mode of the invention by sharing the substrate potentials, a semiconductor integrated circuit includes: a first logic gate (1) using, as an operation power source, a first pair of a high potential and a low potential (VDDL and VSSL, VDDL and VSS); and a second logic gate (2) using, as an operation power source, a second pair of a high potential and a low potential (VDDH and VSSH, VDDH and VSS) having a potential difference larger than that of the first potential pair. Substrate potentials (VBP and VBN, VDDH and VSSH) of MIS transistors in the first logic gate and those of MIS transistors in the second logic gate are common to each other, and at least the first logic gate includes an MIS transistor to which a substrate bias is applied in a reverse direction by the substrate potential.

Specific modes of the pair of the first and second potentials and the substrate potential are as follows. As a first mode, as shown in FIG. 1, the first potential pair includes a first high potential (VDDL) and a first low potential (VSSL), the second potential pair includes a second high potential (VDDH) higher than the first high potential and a second low potential (VSSH) lower than the first low potential, and the substrate potentials includes a high potential side substrate potential (VBP) between the first and second high potentials and a low potential side substrate potential (VBN) between the first and second low potentials. In the mode, as described above, the reverse substrate bias state is achieved in both of the p-channel type MIS transistor and the n-channel type MIS transistor included in the first logic gate, and the forward substrate bias state is achieved in both of the p-channel type MIS transistor and the n-channel type MIS transistor included in the second logic gate.

As a second specific mode, as shown in FIG. 25, the first potential pair includes a first high potential (VDDL) and a first low potential (VSSL), the second potential pair includes a second high potential (VDDH) higher than the first high potential and a second low potential (VSSH) lower than the first low potential, the second high potential (VDDH) is used as a high potential side substrate potential, and the second low potential (VSSH) is used as a low potential side substrate potential. This mode is used when the reverse bias state is achieved in both p-channel type and n-channel type MIS transistors included in the first logic gate, and the substrate bias is not applied to the MIS transistors included in the second logic gate. According to the mode, while promoting the reduction in subthreshold leak in the first logic gate, at least two lines for the power sources and the substrate bias can be reduced as compared with the first mode.

As a third mode, as shown in FIG. 27, the first potential pair includes a first high potential (VDDL) and a first low potential (VSS), the second potential pair includes a second high potential (VDDH) higher than the first high potential and the first low potential (VSS), a potential (VBP) between the first and second high potentials is used as a high potential side substrate potential, and a potential (VBN) higher than the first low potential is used as a low potential side substrate potential. In the mode, the reverse substrate bias state is achieved only for the p-channel type MIS transistor included in the first logic gate, and the forward substrate bias is applied to the n-channel type MIS transistor included in the first logic gate and the n-channel type and p-channel type MIS transistors included in the second logic gate. As described above, by paying attention to the point that the gate width of the p-channel type MIS transistor is wider than that of the n-channel type MIS transistor in consideration of the driving capability or electron conductivity, the reverse substrate bias is applied only to the p-channel type MIS transistor in the first logic gate intended for low power operation. While promoting reduction in the subthreshold leak in the first logic gate, at least one line for the power source and substrate bias can be reduced as compared with the first mode.

4. <Viewpoint of Power Source Line>

According to further another detailed mode of commonly using the substrate potentials, a semiconductor integrated circuit includes: a first logic gate (1) connected to a first pair of a high potential line and a low potential line (VDDL and VSSL, VDDL and VSS); and a second logic gate (2) connected to a second pair of a high potential line and a low potential line (VDDH and VSSH, VDDH and VSS) having a potential difference larger than that of the first potential line pair. A line of substrate potentials (VBP and VBN, VDDH and VSSH) for supplying a substrate potential to an MIS transistor of the first logic gate and a substrate potential line for supplying a substrate potential to an MIS transistor of the second logic gate are commonly used, and at least the first logic gate includes an MIS transistor to which a substrate bias is applied in a reverse direction by the substrate potential.

The specific modes of the first and second potential lines and the substrate potential line correspond to the first to third modes in 3. In the first mode, the first potential line pair includes a first high potential line (VDDL) and a first low potential line (VSSL), the second potential line pair includes a second high potential line (VDDH) having a potential higher than that of the first high potential line and a second low potential line (VSSH) having a potential lower than the first low potential line, and the substrate potential lines include a high potential side substrate potential line (VBP) having a potential between the potential of the first high potential line and the potential of the second high potential line, and a low potential side substrate potential line (VBN) having a potential between the potential of the first low potential line and the potential of the second low potential line.

In the second mode, the first potential line pair includes a first high potential line (VDDL) and a first low potential line (VSSL), the second potential line pair includes a second high potential line (VDDH) having a potential higher than that of the first high potential line and a second low potential line (VSSH) having a potential lower than that of the first low potential line, and the second high potential line (VDDH) is used as a high potential side substrate potential line, and the second low potential line (VSSH) is used as a low potential side substrate potential line.

In the third mode, the first potential line pair includes a first high potential line (VDDL) and a first low potential line (VSS), the second potential line pair is a second high potential line (VDDH) having a potential higher than that of the first high potential line and is the first low potential line (VSS), and the substrate potential line is a high potential side substrate potential line having a potential (VBP) between the potential of the first high potential line and the potential of the second high potential line, and is a low potential side substrate potential line having a potential (VBN) higher than the potential of the first low potential line.

5. <Viewpoint of Layout>

The viewpoint of sharing the substrate potentials may be grasped from the viewpoint of layout of a semiconductor integrated circuit. A semiconductor integrated circuit has a circuit region in which a number of logic gates each having an MIS transistor are arranged on a semiconductor substrate. The circuit region has well regions (NWELL, PWELL) shared by a substrate potential every conduction type of an MIS transistor. In the well regions, a first logic gate (1) using, as an operation power source, a first pair of potentials (VDDL and VSSL, VDDL and VSS) having a relatively small potential difference and a second logic gate (2) using, as an operation power source, a second pair of potentials (VDDH and VSSH, VDDH and VSS) having a relatively large potential difference are formed. In the well regions, a p-type well region (PWELL) in which an n-channel type MIS transistor is formed and an n-type well region (NWELL) in which a p-channel type MIS transistor is formed are adjacent to each other, and metal lines for supplying the first pair of potentials, the second pair of potentials, and a substrate potential are arranged on the well region.

By the configuration as well, the actions similar to the above 1 can be obtained. A semiconductor integrated circuit without an overhead area, realizing improved operating speed, reduced power consumption in an active mode, and reduced power consumption in a standby mode can be realized.

6. <Viewpoint of Signal Amplitude>

The potential difference of the operation power source can be grasped from the viewpoint of an output signal amplitude. From this viewpoint, a semiconductor integrated circuit includes: a first logic gate (1) for generating a relatively small output signal amplitude by using a first pair of potentials (VDDL and VSSL, VDDL and VSS) as an operation power source; and a second logic gate (2) for generating a relatively large output signal amplitude by using a second pair of potentials (VDDH and VSSH, VDDH and VSS) as an operation power source. Substrate potentials (VBP and VBN, VDDH and VSSH) of MIS transistors in the first logic gate and those of MIS transistors in the second logic gate are common to each other. The actions of the configuration are also the same as those of 1.

As a further specific mode, attention is paid to a clock synchronous signal path including the first and second logic gates. Specifically, the first logic gate includes a sequence circuit and a combinational circuit, the second logic gate includes a sequence circuit and a combinational circuit, a plurality of unit signal paths each leading from a sequence circuit to a sequence circuit at the next stage via one or a plurality of combinational circuits are provided, and the plurality of unit signal paths includes a unit signal path in which the first and second logic gates mixedly exist.

In a unit signal path in which the first and second logic gates exist mixedly, the second logic gate is disposed on the upstream side of the first logic gate. By the configuration, a signal having a small signal amplitude is supplied to a circuit having a large output signal amplitude, and an output becomes at the intermediate level. Thus, a situation that a through current occurs can be easily checked.

In order to increase the degree of freedom against the limitation, it is sufficient to use the sequence circuit (F81) adopting the clock synchronous level shifting function. Specifically, in a unit signal path in which the first and second logic gates exist mixedly, a sequence circuit including the second logic gate for receiving an output of a combinational circuit including the first logic gate has, at its input stage, a clock synchronous type level shifting circuit (20) for shifting the level of an input signal amplitude to the level of an output signal amplitude of the second logic gate synchronously with a clock signal. By performing a level shifting operation synchronously with the operation of the sequence circuit for latching an input signal synchronously with the clock signal, the signal propagation delay caused by the level shifting operation can be easily suppressed.

The level shifting function is not limited to be synchronized with a clock. In a unit signal path in which the first and second logic gates exist mixedly, the second logic gate for receiving an output of the first logic gate is a level shifting circuit (G94) for shifting the level of an output signal amplitude of the first logic gate to the level of an output signal amplitude of the second logic gate, and a second logic gate circuit may be connected to an output of the level shifting circuit in series.

7. <Designing Method>

A method of designing a semiconductor integrated circuit by using a first logic gate and a second logic gate in which substrate potentials of MIS transistors of the same conduction type are equal to each other, includes: a first step of determining whether a signal propagation delay time of a signal path in a logic circuit designed by using the first logic gate using, as an operation power source, a first pair of potentials (VDDL and VSSL, VDDL and VSS) having a relatively small potential difference achieves a target time or not; and a second step of replacing one or a plurality of first logic gates included in a signal path having a signal propagation delay time which does not achieve the target time in the first step with a second logic gate using, as an operation power source, a second pair of potentials (VDDH and VSSH, VDDH and VSS) having a relatively large potential difference. By the designing method, timing allowance necessary for a critical path can be easily allowed to be assured. As a result, the designing of the semiconductor integrated circuit without an overhead area, realizing improved operation speed, reduced power consumption in an active mode, and reduced power consumption in a standby mode is facilitated.

When the required timing allowance cannot be obtained by one replacement operation, it is sufficient to include a third step for determining whether a signal propagation delay time of the signal path in which replacement is performed in the second step achieves the target time or not and, if it does not achieve the target time, replacing another first logic gate included in the signal path with a second logic gate.

As a means for suppressing a situation that a signal having a small amplitude is supplied to a circuit having a large output signal amplitude, an output becomes at an intermediate level, and a through current occurs, in the second and third steps, the replacement with the second logic gate is performed from the upstream side of the signal path. Consequently, although the degree of freedom in the replacing position is low to a certain extent, the through current can be easily checked by the replacement rule.

In order to increase the degree of freedom in designing against the limitation, it is sufficient to use the sequence circuit (F81) adopting the clock synchronous level shifting function. In the second and third steps, when the second logic gate as a sequence circuit is disposed at the next stage of a first logic gate, the second logic gate has, at its input stage, a clock synchronous type level shifting function for shifting the level of an input signal amplitude to the level of an output signal amplitude of the second logic gate synchronously with the clock signal.

In order to increase the degree of freedom in designing against the limitation of using the sequence circuit with the clock synchronous level shifting function, in the second and third steps, when the second logic gate is disposed at the next stage of the first logic gate, it is sufficient to use the method of inserting a level shifting circuit (G94) for shifting the level of an output signal amplitude to the level of an output signal amplitude of the second logic gate in front of the second logic gate.

8. <Program Recording Medium>

On a program recording medium (91), a program for supporting designing of a semiconductor integrated circuit using a first logic gate and a second logic gate in which a substrate potential of MIS transistors of the same conduction type are equal to each other is recorded so as to be read by a computer (90). The program executes: a first step of determining whether a signal propagation delay time of a signal path in a logic circuit designed by using the first logic gate using, as an operation power source, a first pair of potentials (VDDL and VSSL, VDDL and VSS) having a relatively small potential difference achieves a target time or not; and a second step of replacing one or a plurality of first logic gates included in a signal path having a signal propagation delay time which does not achieve the target time in the first step with a second logic gate using, as an operation power source, a second pair of potentials (VDDH and VSSH, VDDH and VSS) having a relatively large potential difference. By reading the program from the recording medium and executing it by the computer, the designing of a logic circuit by the designing method is facilitated.

When the case where predetermined timing allowance cannot be obtained by one replacing operation is considered in advance, the program can further execute a third step for determining whether a signal propagation delay time of the signal path in which replacement is performed in the second step achieves the target time or not and, if it does not achieve the target time, replacing another first logic gate included in the signal path with a second logic gate.

9. <Design Data Recording Medium>

On a design data recording medium (91), design data for designing an integrated circuit to be formed on a semiconductor chip by using a computer is recorded so as to be read by the computer. The design data includes: first mask pattern data for determining a figure pattern for forming a first logic gate to which an operation power source is supplied from a first pair of potential lines (VDDL and VSSL, VDDL and VSS) having a relatively small potential difference and a substrate potential is supplied from a substrate potential line on the semiconductor chip; and second mask pattern data for determining a figure pattern for forming a second logic gate to which an operation power source is supplied from a second pair of potential lines (VDDH and VSSH, VDDH and VSS) having a relatively large potential difference and a substrate potential is supplied from a substrate potential line on the semiconductor chip. The design data recorded on the design data recording medium is, for example, verified mask pattern data for forming what is called a hardware IP module. By using the data for designing a layout by a computer, the designing of the semiconductor integrated circuit from the viewpoint of sharing the substrate potentials can be extremely facilitated.

The design data may be data described in a hardware description language such as what is called a software IP module. Specifically, design data recorded on a design data recording medium (91) so as to be read by a computer includes: first function description data for determining a function of a first logic gate to which an operation power source is supplied from a first pair of potential lines (VDDL and VSSL, VDDL and VSS) having a relatively small potential difference and a substrate potential is supplied from a substrate potential line; and second function description data for determining a function of a second logic gate to which an operation power source is supplied from a second pair of potential lines (VDDH and VSSH, VDDH and VSS) having a relatively large potential difference and a substrate potential is supplied from a substrate potential line connected to the substrate potential line. The function description data does not specify a circuit pattern unlike mask pattern data. Instead, the degree of freedom in a layout pattern is relatively high and a function change is relatively easily made.

BRIEF DESCRIPTION OF THE DRAWINGS

FIGS. 10A to 10C are diagrams for explaining the details of a replacing process described in FIG. 8.

FIGS. 15A to 15D are explanatory diagrams showing the details of the replacing process described in FIG. 14.

DETAILED DESCRIPTION OF THE PREFERRED EMBODIMENT

<Sharing of Substrate Potential>

Figure 1:
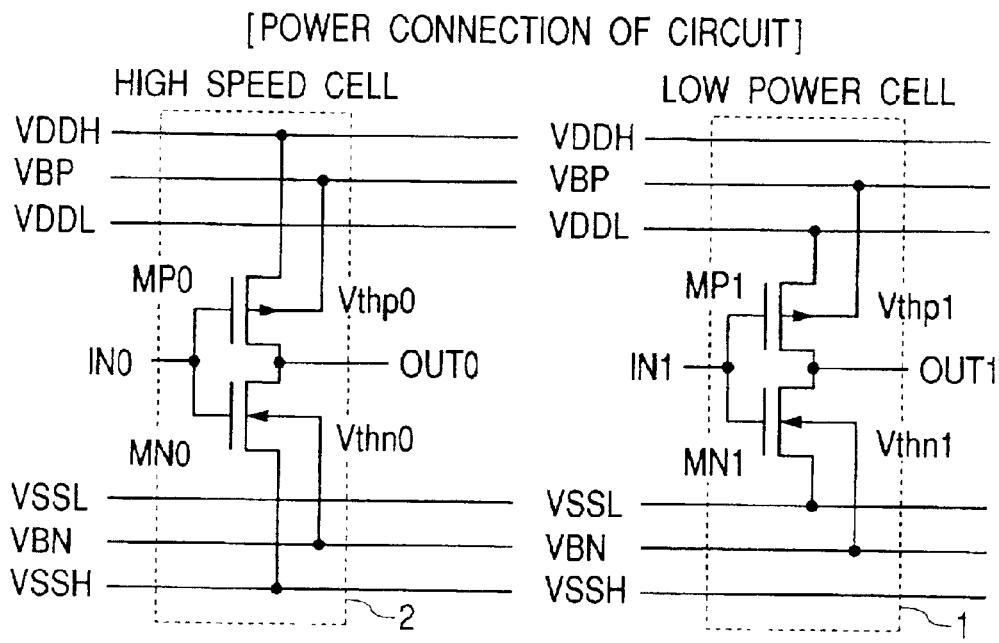
FIG. 1 is a circuit diagram showing an example of first and second logic gates of a semiconductor integrated circuit according to the invention.

FIG. 1 shows an example of a first logic gate and a second logic gate of a semiconductor integrated circuit according to the invention. Shown in FIG. 1 is a first logic gate 1 and a second logic gate 2 each forming a CMOS inverter as a typical example.

Figure 2:
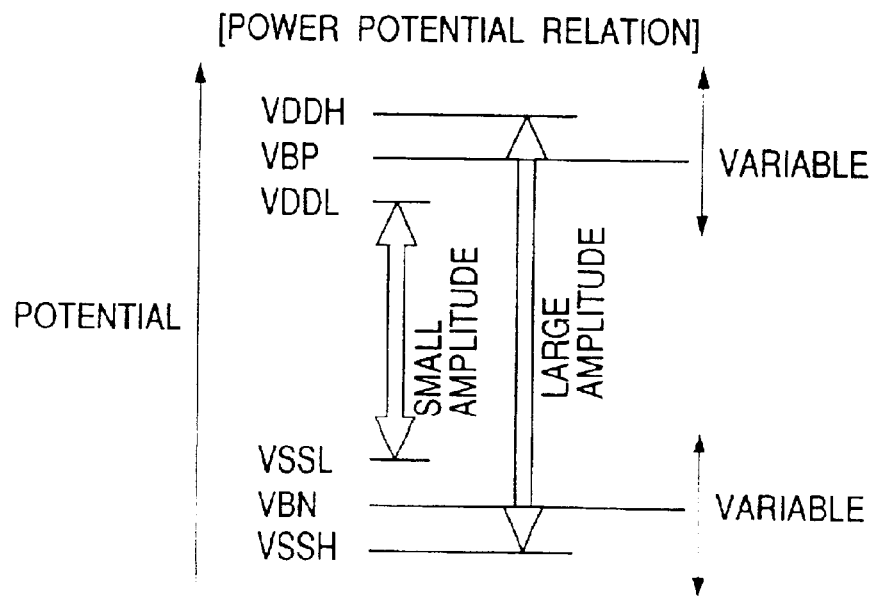
FIG. 2 is a diagram for explaining the relation of potentials shown in FIG. 1.

In FIG. 1, MP0 and MP1 denote p-channel MOS transistors (hereinbelow, simply called pMOS transistors) and MN0 and MN1 express n-channel MOS transistors (hereinbelow, simply called nMOS transistors). Shown in the diagram are a first power source potential VDDL on a high potential side, a second power source potential VDDH on a high potential side, a first ground potential VSSL on a low potential side, and a second ground potential VSSH on a low potential side. VBP denotes a substrate potential of the pMOS transistors MP0 and MP1, and VBN indicates a substrate potential of the nMOS transistors MN0 and MN1. The relations of the potentials are set so that, as shown in FIG. 2, the order of the potentials from the highest to lowest is VDDH, VDDL, VSSL, and VSSH. The substrate potential VBP is set within a range higher than the power source potential VDDL, and the substrate potential VBN is set within a range lower than the ground potential VSSL. The potentials VDDL and VSSL make a first pair of potentials. The potentials VDDH and VSSH make a second pair of potentials.

In the second logic gate 2 shown in FIG. 1, the source electrode of the pMOS transistor MP0 as a component of the CMOS inverter is connected to the source potential VDDH, and the source electrode of the nMOS transistor MN0 is connected to the ground potential VSSH, so that an output amplitude of the second logic gate 2 becomes VDDH-VSSH. On the other hand, in the first logic gate 1 in FIG. 1, the source electrode of the pMOS transistor MP1 as a component of the CMOS inverter is connected to the power source potential VDDL, and the source electrode of the nMOS transistor MN1 is connected to the ground potential VSSL, so that an output amplitude of the first logic gate 1 becomes VDDL-VSSL. From the configuration of FIG. 1, it is understood that the output amplitude of the second logic gate 2 is larger than that of the first logic gate 1. Generally, a circuit having a large voltage amplitude operates at higher speed than a circuit having a small voltage amplitude since a drain-source voltage or a gate-source voltage of an MOS transistor is higher, and the driving force of the MOS transistor increases. It can be therefore said that the CMOS inverter of the second logic gate 2 operates at higher speed than the CMOS inverter of the first logic gate 1. On the other hand, when attention is paid to power consumption of a circuit, since the power consumption in logic operation is proportional to the square of the voltage amplitude, it can be said that the CMOS inverter of the first logic gate 1 consumes less power.

In FIG. 1, the substrate potential of the MOS transistors are commonly used by the first and second logic gates 1 and 2. Specifically, in the first and second logic gates 1 and 2, the substrate electrodes of the PMOS transistors MP0 and MP1 are commonly connected to the substrate potential VBP, and the substrate electrodes of the nMOS transistors MN0 and MN1 are commonly connected to the substrate potential VBN. Consequently, the first and second logic gates 1 and 2 can be formed on a common substrate (well region), so that the isolating region in the substrate as required in the technique of the second literature is unnecessary. Thus, the degree of freedom in layout of the semiconductor integrated circuit in which the first and second logic gates having different operating power sources are formed can be increased, and the chip area of the semiconductor integrated circuit can be reduced.

The point of realizing both high-speed operation and low-power operation (low subthreshold leak operation) of a circuit by properly setting the substrate potentials VBP and VBN will now be described.

Figure 3:
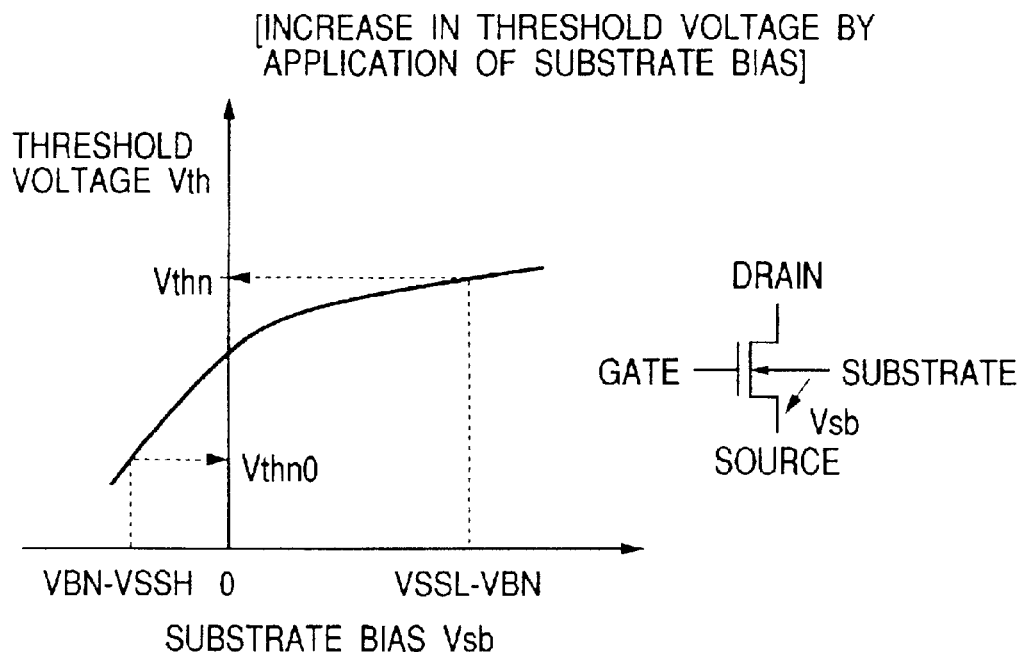
FIG. 3 is a characteristic diagram showing increase in threshold voltage by application of a substrate bias voltage in an nMOS transistor.

It is generally known that by setting the substrate potential of a MOS transistor to be a potential different from the source potential (which is called substrate biasing), the threshold voltage of the MOS transistor changes. For example, as shown in FIG. 3, by setting the substrate potential of the nMOS transistor to be lower than the source potential (reverse-biasing), the threshold voltage increases as compared with the case where no bias is applied, and by setting the substrate potential to be higher than the source potential (forward biasing), the threshold voltage decreases as compared with the case where no bias is applied. It is now assumed that the potential of the substrate bias voltage VBN lies between the ground potentials VSSL and VSSH. In this case, a forward bias of VBN-VSSH is applied to the nMOS transistor MN0 in FIG. 1, and a reverse bias of VSSL-VBN is applied to the nMOS transistor MN1 in FIG. 1. It is understood from FIG. 3 that the threshold voltages at this time are Vthn0 and Vthn1 which have the relation of Vthn0<Vthn1. The threshold voltage exerts a strong influence on the operation speed of a circuit. When a MOS transistor of a lower threshold voltage is used, higher operation speed can be achieved. Consequently, it can be said that the operation speed of the second logic gate 2 in FIG. 1 is higher than that of the first logic gate 1 also from this point of view.

Figure 4:
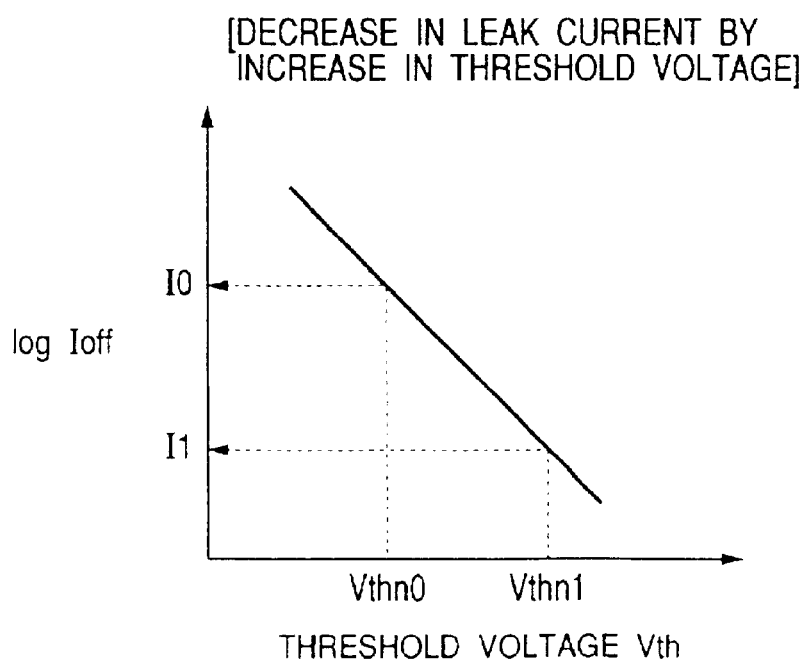
FIG. 4 is a characteristic diagram showing reduction in leak current by increase in threshold voltage in an nMOS transistor.

The relation between the threshold voltage of a MOS transistor and a leak current Ioff will be examined. Usually, even when a MOS transistor is in a non-conducting state, a subthreshold leak current exists. The subthreshold leak current has characteristics that it strongly depends on the threshold voltage of a MOS transistor and increases as the threshold voltage decreases. FIG. 4 schematically shows the relation between the threshold voltage of a MOS transistor and the leak current Ioff. It is understood that in the nMOS transistors MN0 and MN1 having the relation of Vthn0<Vthn1, leak currents I0 and I1 exist, respectively, and I0 is larger than I1. Therefore, from the viewpoint of the leak current as well, it can be said that the first logic gate 1 in FIG. 1 consumes less power than the second logic gate 2.

The substrate bias potential VBN is now set so as to be close to the ground potential VSSL. The forward bias applied to the nMOS transistor MN0 becomes higher and the threshold voltage further decreases, so that the operating speed of the second logic gate 2 in FIG. 1 becomes higher. The reverse bias applied to the nMOS transistor MN1 becomes lower and the threshold voltage decreases, so that the first logic gate 1 in FIG. 1 also operates at higher speed. In this case, however, since the threshold voltage of the MOS transistors in the semiconductor integrated circuit decreases as a whole, a leak current increases. The substrate bias potential VBN cannot be freely increased but has to be increased within a range where latch-up and junction leak of a parasitic diode do not occur in the second logic gate 2 in FIG. 1.

The case of setting the substrate bias potential VBN close to the ground potential VSSH will now be examined. The forward bias to the nMOS transistor MN0 becomes lower and the reverse bias to the nMOS transistor MN1 becomes higher. This means that both of the threshold voltages of the nMOS transistors MN0 and MN1 become higher, so that the leak current decreases but the speed of the circuit deteriorates a little.

It is therefore suitable to set the substrate potential VBN in consideration of both operation speed necessary for a semiconductor integrated circuit which is being designed and power consumption.

In the description using FIGS. 3 and 4, attention is paid only to an nMOS transistor for simplicity. A similar idea can be also applied to a pMOS transistor. Briefly, in the case of a pMOS transistor, it is sufficient to determine the substrate potential on the basis of the fact that by setting the substrate potential to be higher than a source potential (reverse biasing), the threshold voltage increases as compared with the case where no bias is applied and, by setting the substrate potential to be lower than the source potential (forward biasing), the threshold voltage decreases as compared with the case where no bias is applied. When the potential of the substrate bias voltage VBP lies between the power source potentials VDDL and VDDH, the forward bias of VDDH-VBP is applied to the pMOS transistor MP0 in FIG. 1, and the reverse bias of VBP-VDDL is applied to the pMOS transistor MP1 in FIG. 1. The threshold voltages Vthp0 and Vthp1 of the pMOS transistors MP0 and MP1 come to have the relation of Vthp0<Vthp1. With respect to the substrate bias voltage of the pMOS transistor as well, the second logic gate 2 operates at higher speed as compared with the first logic gate 1, and the first logic gate 1 operates with lower power as compared with the second logic gate 2. As described above, it is sufficient to set the substrate potential VBP in consideration of both the operation speed necessary for a semiconductor integrated circuit being designed and power consumption.

For simplicity, the inverter is used as an example of the logic circuit in FIG. 1. The invention is not limited to the example but a combinational circuit such as a NAND gate or a NOR gate, or a sequence circuit such as a flip flop may be used. For convenience, in the following description, the second logic gate using, as an operation power source, a pair of relatively large potentials typified by the second logic gate 2 in FIG. 1 will be also called a high-speed cell, and the first logic gate using, as an operation power source, a pair of relatively small potentials typified by the first logic gate 1 will be also called a low-power cell.

Figure 5:
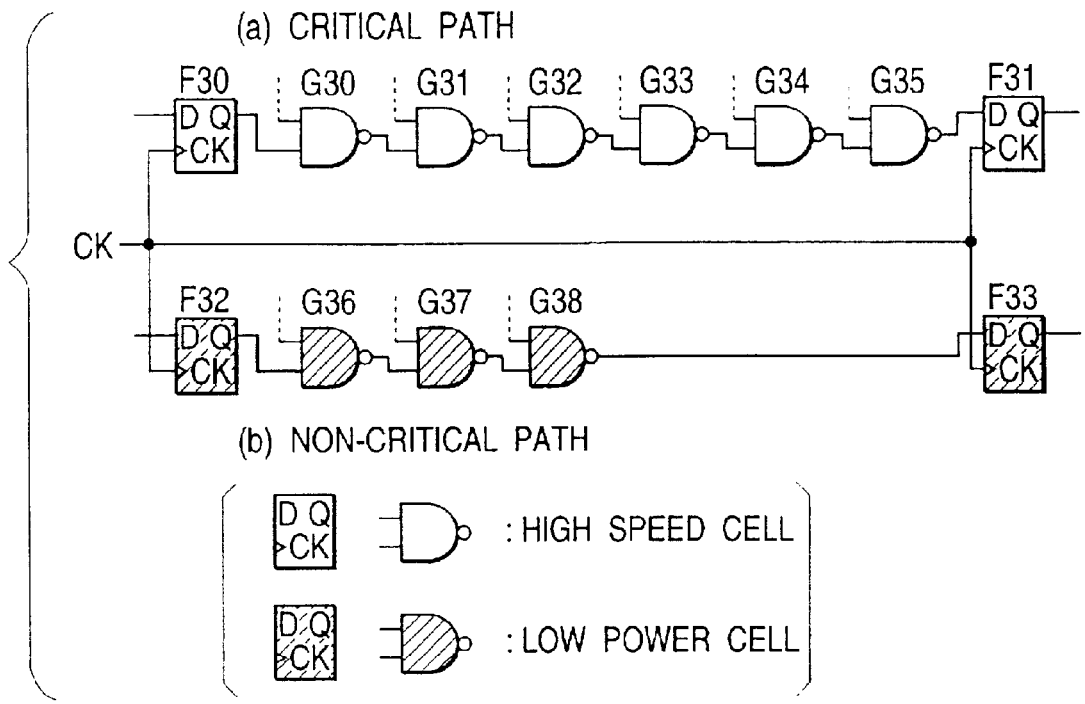
FIG. 5 is a logic circuit diagram showing an example of the configuration of signal paths in a semiconductor integrated circuit using a high-speed cell and a low-power cell.

FIG. 5 shows an example of the configuration of signal paths in a semiconductor integrated circuit using high-speed cells and low-power cells.

Shown in the diagram a clock signal CK, flip flops F30 and F31 serving as high-speed cells, flip flops F32 and F33 serving as low-power cells, a NAND gate G35 regarded as a high-speed cell by G30, and a NAND gate G38 regarded as a low-power cell by G36. In FIG. 5, for simplicity, all of the logic gates G30 to G38 are expressed as NAND gates. The semiconductor integrated circuit device of the invention is not limited to the arrangement but can be applied to a logic gate having a proper logic. Signals unnecessary for the description are not shown in the diagram. As shown in FIG. 5, a signal path extending from a sequence circuit to a sequence circuit at the next stage via one or a plurality of combinational circuits, such as a signal path from the flip flop F30 to the flip flop F31 and a signal path from the flip flop F32 to the flip flop F33 will be called a unit signal path.

It is now assumed that the circuit shown as an example in FIG. 5 is to be operated at a speed of 250 MHz. For this purpose, each of the time required for the clock signal CK supplied to the flip flop F30 to propagate to the flip flop F31 and the time required for the clock CK supplied to the flip flop F32 to propagate to the flip flop F33 has to be 4 ns or less. It is now assumed that a delay time of the flip flop of a high-speed cell type is 1 ns, that of the NAND gate of a high-speed cell type is 0.5 ns, that of the flip flop of a low-power cell type is 1.6 ns, and that of the NAND gate of a low-power cell type is 0.8 ns. On the above assumption, the delay time was calculated. Each of the delay time in propagation of the signal to F33 since the supply of the clock CK to F30 in the critical path (A) in FIG. 5 and that in propagation of the signal to F31 since the supply of the clock CK to F33 is 4 ns. It is understood that the target is attained. If all of the cells in the critical path (A) of FIG. 5 are replaced by low-power cells, the delay time becomes 6.4 ns and the target cannot be achieved. In short, the example of FIG. 5 indicates that there is a case such that a logic gate of a high-speed cell type and a logic gate of a low-power cell type have to be selectively used in accordance with delay time in signal propagation in a unit signal path in a semiconductor integrated circuit.

Figure 6:
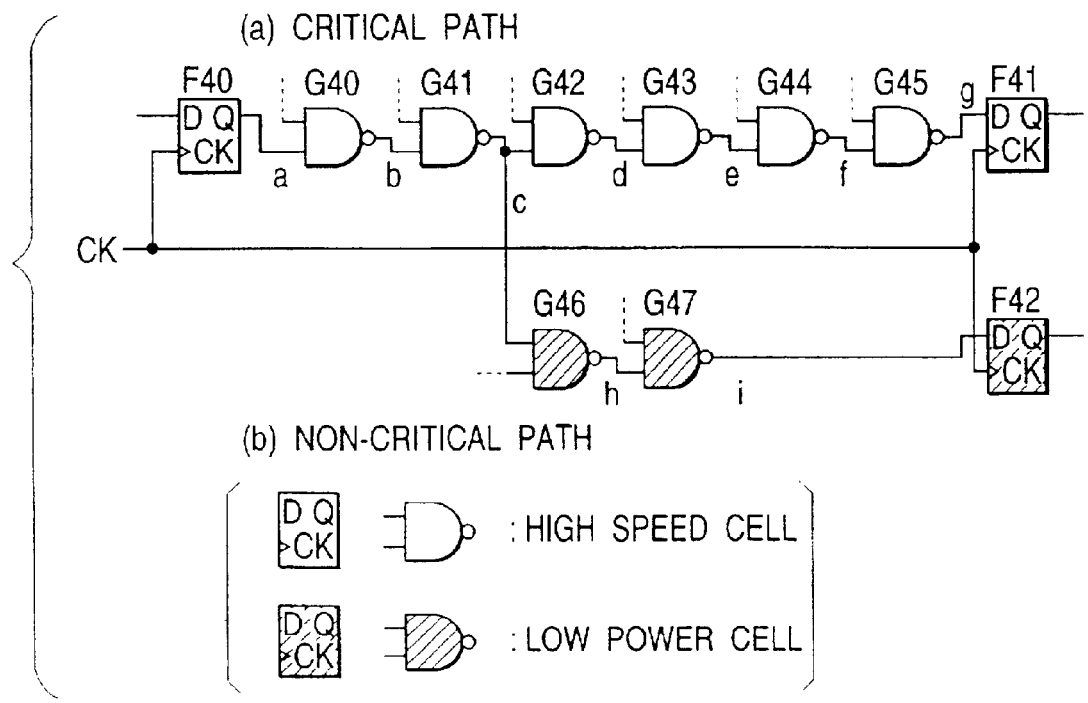
FIG. 6 is a logic circuit diagram showing another example of the configuration of signal paths in a semiconductor integrated circuit using a high-speed cell and a low-power cell.

FIG. 6 shows another example of signal paths in a semiconductor integrated circuit using the high-speed cells and the low-power cells. Shown in the diagram a clock signal CK, flip flops F40 and F41 of a high-speed cell type, a flip flop F42 of a low-power cell type, NAND gates G40 to G45 of a high-speed cell type, and NAND gates G46 and G47 of a low-power cell type. Reference characters (a) to (i) denote nodes. In a manner similar to the case of FIG. 5, the cells are not limited to NAND gates, and signals not related to the description are not shown in the diagram. The circuit of FIG. 6 starts from the flip flop F40, is branched at the node (c) into two, and ends at the flip flops F41 and F42.

Figure 7A:
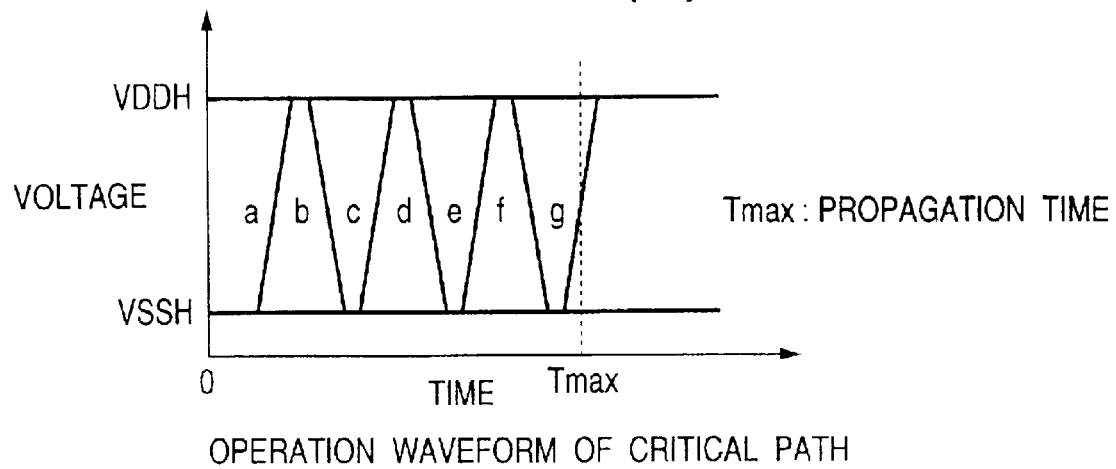
FIGS. 7A and 7B are waveform charts showing an example of operating waveforms of a critical path and a non-critical path in FIG. 6.
Figure 7B:
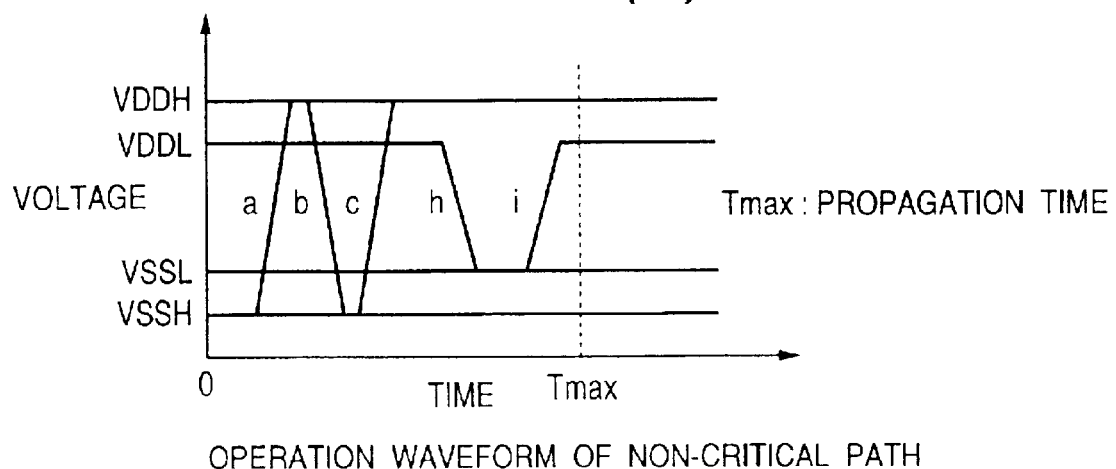

FIGS. 7A and 7B show operation waveforms of the critical path and the non-critical path in FIG. 6. FIG. 7A shows a waveform chart of a critical path (a) starting from F40 and ending at F41, and FIG. 7B shows a waveform chart of the non-critical path (b) starting from F40 and ending at F42. It is understood from FIG. 7A that all of the nodes (a) to (g) operate with an amplitude VDDH-VSSH, and propagation time is Tmax. It is understood from FIG. 7B that each of the nodes (a) to (c) operates with an amplitude VDDH-VSSH. In the nodes (h) and (i), the amplitude decreases to VDDL-VSSL and delay time per NAND gate increases. However, the delay time of the whole path is shorter than Tmax. Since the voltage amplitude is as large as VDDH-VSSH in each of the nodes (a) to (g), the power consumption is high. In the nodes (h) and (i), however, since the amplitude is as small as VDDL-VSSL, power consumption can be suppressed. Further, the circuit of F42, G46, and G47 has a leak current smaller as compared with the circuit including F40, F41, and G40 to G45.

<Designing Method>

A method of designing a semiconductor integrated circuit to which the invention is applied will be described with reference to FIGS. 8 and 9.

Figure 8:
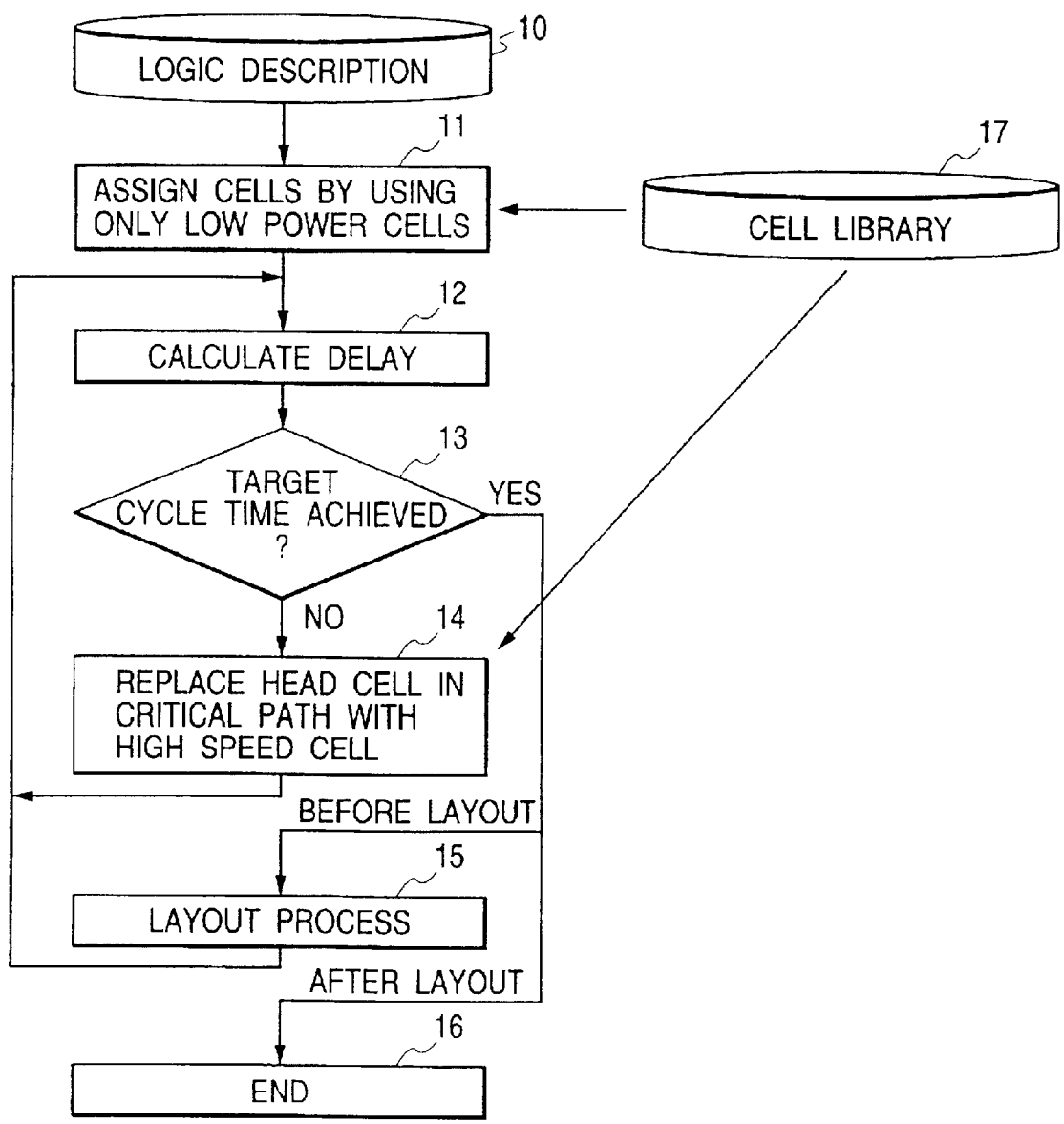
FIG. 8 is a flowchart showing an example of a method of designing a semiconductor integrated circuit using a lower-power cell and a high-speed cell.
Figure 9A:
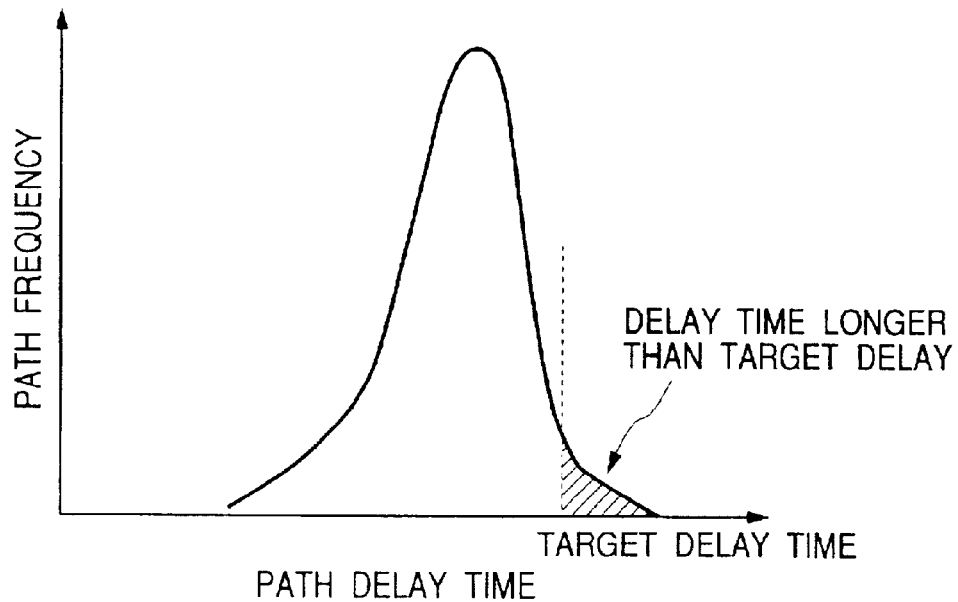
FIGS. 9A and 9B are diagrams showing a distribution of path delay in the case where only lower-power cells are used and a distribution of path delay in the case where a high-speed cell is used for the critical path.
Figure 9B:
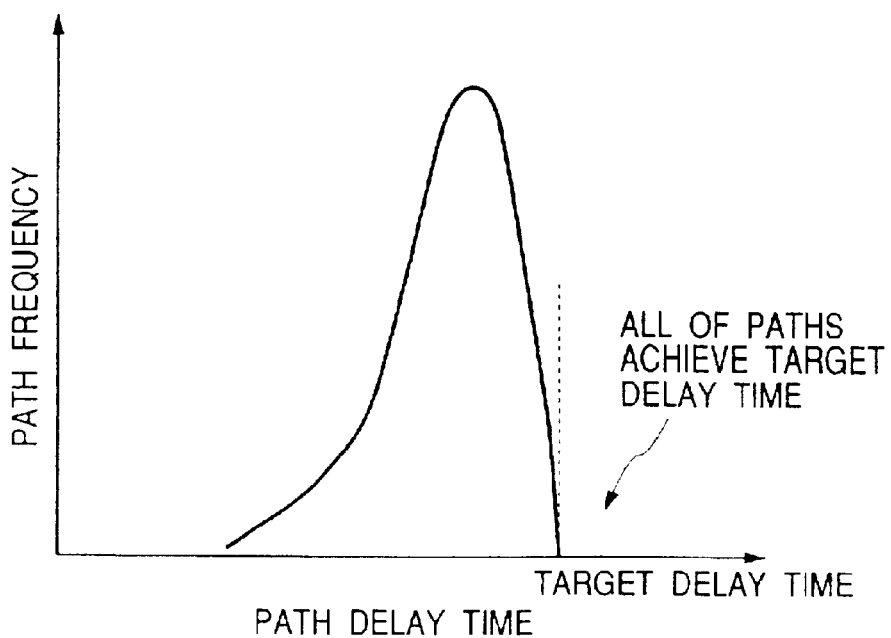

In FIG. 8, step 10 relates to logic description. The functions of a semiconductor integrated circuit to be designed are described by using a high-order logic description language such as VHDL (Very high speed integrated circuit Hardware Description Language). First, by using the logic description 10 and a cell library 17, logic conversion to a gate level using only low-power cells is performed (step 11). At this stage, logic optimization to a certain extent is performed. In step 12, delay of each signal path is calculated. As a result, frequency distribution shown in FIG. 9A is obtained. The distribution is obtained by calculating delay of all signal paths existing in a semiconductor integrated circuit. The lateral axis expresses path delay and the vertical axis denotes frequency. Subsequently, in step 13, whether target cycle time is achieved or not is determined. If the target is achieved, the program advances to a layout process in step 15. In the example, however, as understood from FIG. 9A, paths having delays slightly longer than the target delay exist. In step 14, a process of replacing the head cell of a path having a delay longer than the target delay (critical path) with a high-speed cell having the same logic is performed. After that, the delay calculation is executed again in step 12. The loop of steps 12, 13, and 14 is performed until there is no path having a delay longer than the target delay and the state of FIG. 9B is obtained. After all of the paths achieve the target delay, the program advances to step 15 of a layout process. After all of the logic gates are disposed and interconnected, the delay calculation (step 12) is executed again by using information of an interconnection load. If the state of FIG. 9A is resulted again, the loop of steps 12, 13, and 14 is repeated until the state of FIG. 9B is obtained, and the process is finished (16). By the designing method, finally, the delays of all of signal paths become within the target cycle time.

The processes described by referring to FIGS. 8 and 9 will be described more specifically by using FIGS. 10A to 10C. FIG. 10A is a schematic diagram expressing a signal path formed by using only low-power cells. It is assumed that circuits shown in FIGS. 10A to 10C have delay characteristics similar to those shown in FIG. 6. Time between the instance when the clock CK is supplied to the flip flop F70 and the instance when the signal propagates to the input terminal of the flip flop F71 is calculated as 5.6 ns. Assuming now that the target cycle time is 4 ns, the delay of the circuit is longer than the target. Consequently, the process in step 14 in FIG. 8 is performed. First, the flip flop F70 as the head cell of the unit signal path is replaced by a high-speed cell having the same logic. The state after replacement is shown in FIG. 10B. The delay of the circuit is calculated as 5 ns which is still longer than 4 ns as a target. The second cell G70 in the unit signal path is therefore replaced with a high-speed cell. After that, delay calculation is executed. Since the result does not achieve the target, the cell G71 is replaced by a high-speed cell. The loop is repeated, and a state after replacing the cells F70 and G70 to G73 with high-speed cells is shown in FIG. 10C. The delay of the circuit is calculated as 3.8 ns which is shorter than the target cycle time. The cell replacement is therefore completed.

By the designing method, a timing allowance necessary for a critical path can be easily assured. As a result, it becomes easy to design a semiconductor integrated circuit without an overhead area, realizing increased operating speed, reduced power consumption in an active mode, and reduced power consumption in a standby mode. As means for preventing a situation that a signal having a small amplitude is supplied to a circuit of which output signal has a large amplitude, and an output of the circuit becomes an intermediate level, thereby generating a through current, cells in a critical path are replaced with high-speed cells from the head cell as shown in step 14 in FIG. 8. Although the degree of freedom in the replacement position is regulated to a certain extent, generation of the through current can be relatively easily prevented by the replacement rule.

Figure 11:
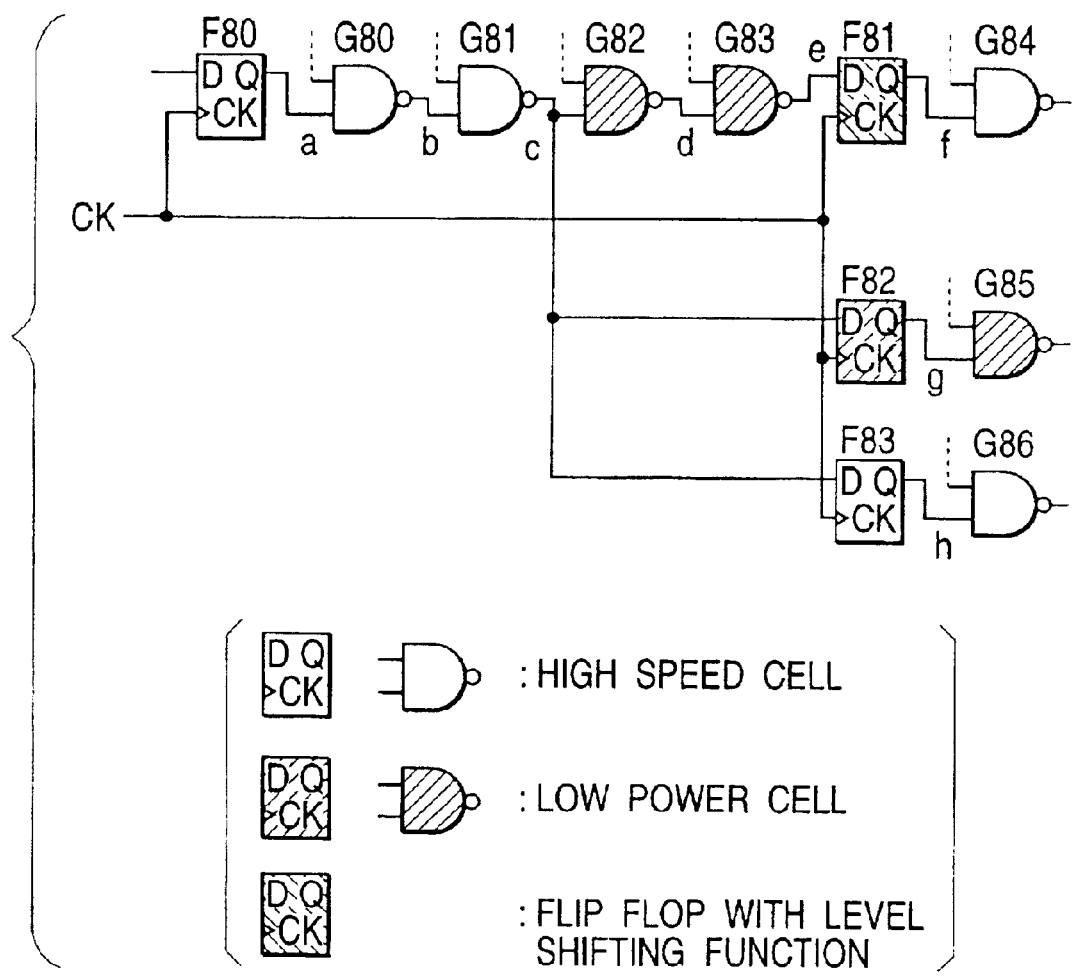
FIG. 11 is a logic circuit diagram showing an example of another unit signal path in which a high-speed cell and a low-power cell mixedly exist.

FIG. 11 shows an example of another unit signal path in which high-speed cells and low-power cells mixedly exist. In the example of FIG. 11, a signal path is branched into three paths at a node (c). The three paths are a path leading to a flip flop F81, a path leading to a flip flop F82, and a path leading to a flip flop F83. Signal amplitudes at nodes (e), (f), (g), and (h) will be described. At the node (e), an output of a low-power cell G83 appears, so that an amplitude is VDDL-VSSL. At the node (g), an output of a low-power cell F82 appears, so that an amplitude is VDDL-VSSL. At the node (h), an output of a high-speed cell F83 appears, so that an amplitude is VDDH-VSSH. A circuit configuration used for the flip flop F81 has to be considered. When it is assumed that a low-power cell is used as F81, the amplitude at the node (f) becomes VDDL-VSSL. Since a cell G84 connected at the next stage is a high-speed cell, when the amplitude at the node (f) is VDDL-VSSL, a through current is generated in the cell G84. When a high-speed cell is used as F81, since the amplitude at the output node (e) of the cell G83 at the front stage is VDDL-VSSL, a through current is generated in the cell F81. As one of measures for solving the problem, as the cell F81, a flip flop with a level shifting function is used. The flip flop with the level shifting function has, at its input stage, a clock-synchronous type level shifting circuit for shifting an amplitude of an input signal to an amplitude of an output signal of a high-speed cell synchronously with a clock signal. FIG. 11 shows an example where the flip flop with the level shifting function is used as F81. In such a manner, even when the amplitude at the node (e) is VDDL-VSSL, the amplitude at the node (f) can be set to VDDH-VSSH, and the problem of the through current does not occur.

Figure 12:
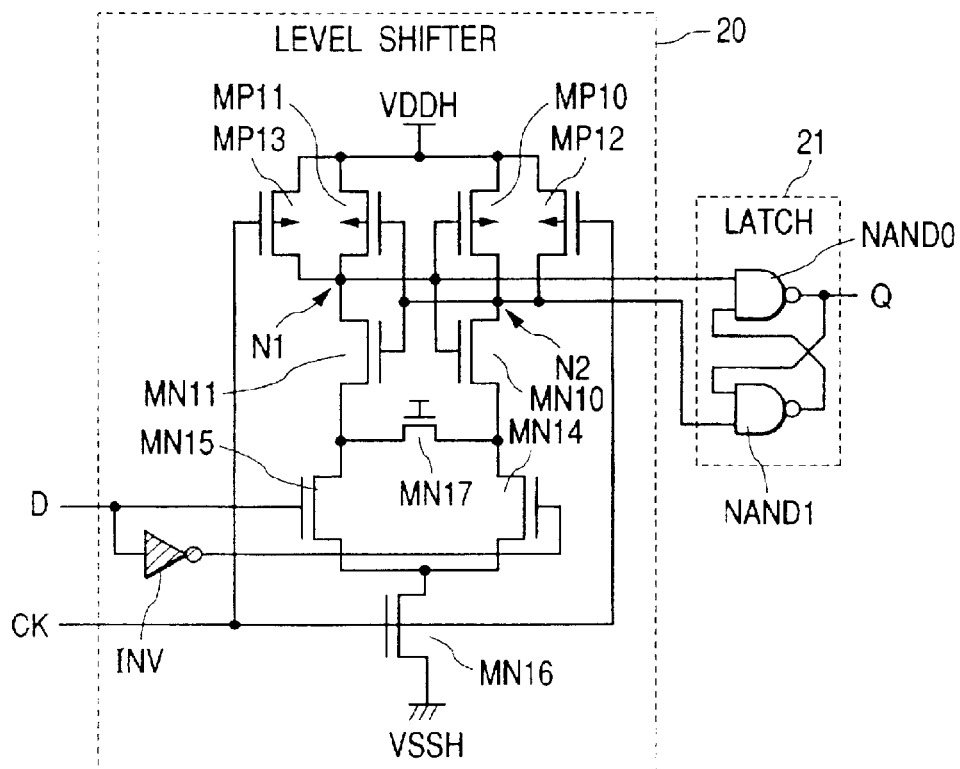
FIG. 12 is a circuit diagram showing an example of a flip flow with a level shifting function used for replacement.
Figure 13:
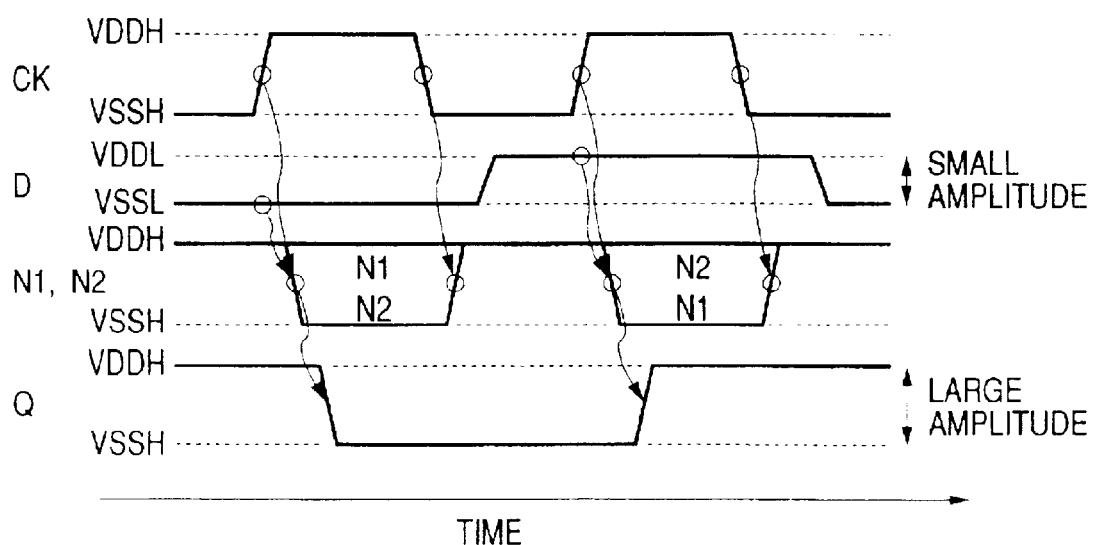
FIG. 13 is an operation waveform chart of the flip flop with the level shifting function shown in FIG. 12.

FIG. 12 shows an example of the flip flop with the level shifting function. FIG. 13 shows operation waveforms of the flip flop with the level shifting function shown in FIG. 12.

The flip flop with the level shifting function shown in FIG. 12 is constructed by a level shifter 20 at the first stage and a latch 21 at the post stage. The level shifter 20 has a CMOS static latch including nMOS transistors MN10 and MN11 and pMOS transistors MP10 and MP11, two p-channel type preset MOS transistors MP12 and MP13, n-channel type differential input MOS transistors MN14 and MN15, an n-channel type power switch MOS transistor MN16, an inverter INV, and an n-channel type MOS transistor MN17 which is always in an ON state and has a relatively small mutual conductance. The latch 21 is constructed by NAND gates NAND0 and NAND1 each of which has an input terminal coupled to an output terminal of the other. Since an input signal D has an output amplitude of a low-power cell, to make the input amplitudes of the differential input MOS transistors the same, an inverter 22 operates on the operation power sources VDDL and VSSL similar to that of a low-power cell. The MOS transistor MN17 is used to prevent that the drains of the MOS transistors MN14 and MN15 enter a floating state and their retained values are undesirably inverted, and is necessary to make the level shifter 20 statically operate.

When the input terminals N1 and N2 of the latch 21 are at the "H (high)" level, the output terminal Q maintains the output status corresponding to the immediately preceding input status. In the level shifter 20, the preset MOS transistors MP12 and MP13 preset the nodes N1 and N2 to the "H" level during the period in which the clock CK is at the low level. In response to the high level period of the clock signal CK, the level shifter 20 can perform level shifting operation. Specifically, according to differential inputs based on the logic value of the input signal D, the static latch circuit performs latching operation, and the latch 21 performs the latching operation in accordance with the data latched by the nodes N1 and N2. In the period in which the clock signal CK is at the low level, the nodes N1 and N2 are preset to "H", and the latch 21 maintains the output Q as it is. When the clock CK goes high, the input signal D having the amplitude of VDDL-VSSL is amplified to a signal having the amplitude of VDDH-VSSH. The amplified signal is stored in the latch in which NAND0 and NAND1 are cross-coupled. Only the inverter INV for receiving the input signal D operates on the operation power sources VDDL and VSSL. The other components operate on the operation power sources VDDH and VSSH.

When the flip flop F81 with the level shifting function is used, an exception to the rule such that the cells are replaced with high-speed cells from the upstream side of the unit signal path can be allowed. The degree of freedom in designing of the semiconductor integrated circuit can be improved to a certain extent.

Figure 14:
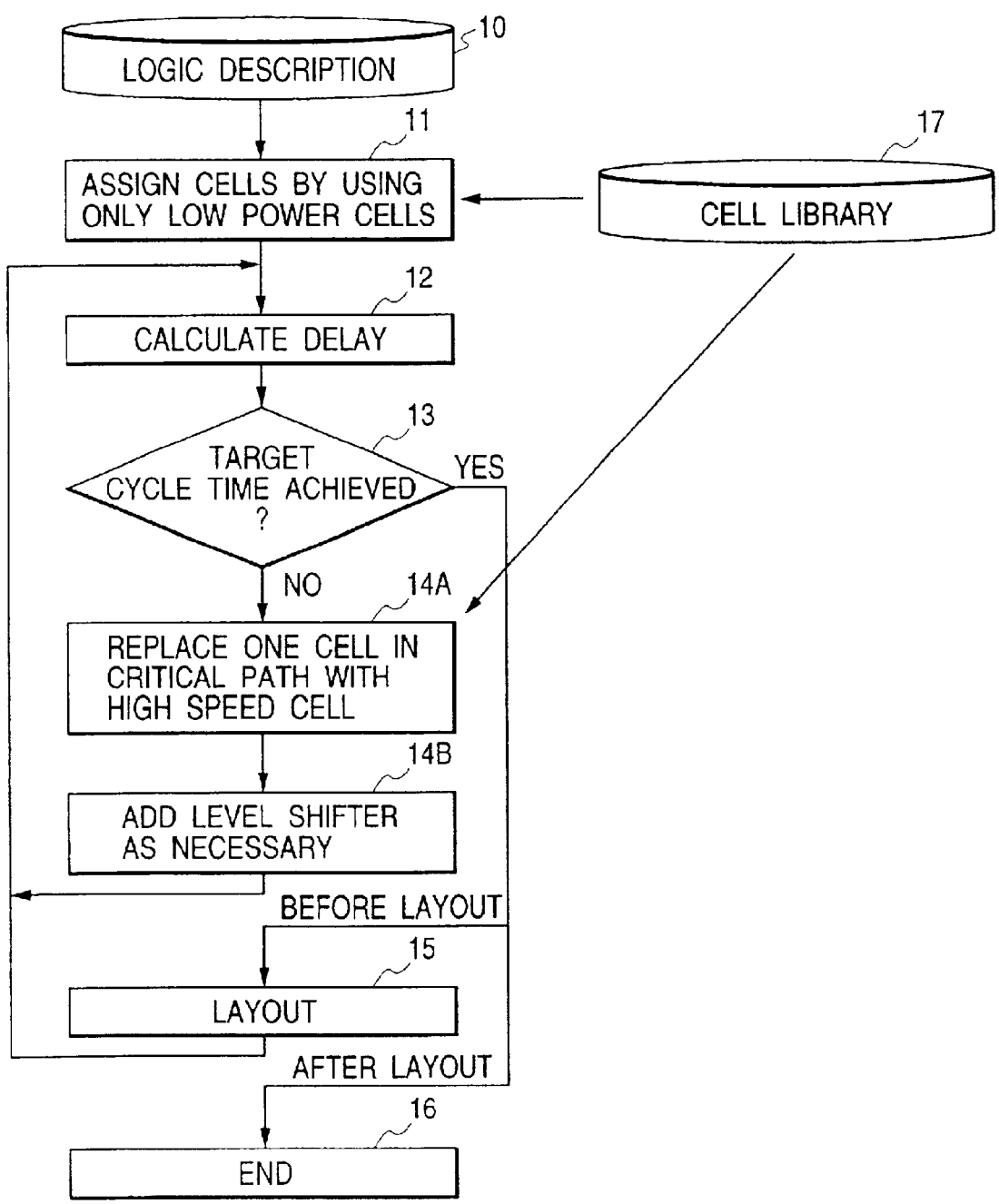
FIG. 14 is a flowchart showing another example of a method of designing a semiconductor integrated circuit using a low-power cell and a high-speed cell.

Referring to FIGS. 14 and 15, another method of designing a semiconductor integrated circuit to which the invention is applied will be described. FIGS. 14 and 15 show design flows of the designing method in which a clock-synchronous flip flop with the level shifting function is used and, moreover, insertion of a level shifter in some midpoint of the unit signal path is allowed. To be specific, the design flow relates to a case such that when a cell in a critical path is replaced by a high-speed cell and the front stage of the high-speed cell is a low-power cell, it means that a signal having a relatively small amplitude (VDDL, VSSL) is supplied to a circuit having a relatively large amplitude (VDDH, VSSH), so that the level shifter is additionally inserted. The designing method of FIG. 14 is different from that of FIG. 8 with respect to the following point. In place of the process of step 14 in FIG. 8, after step 13 of determination of whether the target cycle time is achieved or not, for a path having a delay longer than the target delay, one of the cells in the critical path is replaced by a high-speed cell having the same logic (step 14A). When the front stage of the replaced high-speed cell is a low-speed cell, a level shifter is added at the front stage of the replaced high-speed cell (step 14B).

The processes in FIG. 14 will be described more specifically by using FIGS. 15A to 15D. FIG. 15A is a schematic diagram showing a signal path constructed by using only low-power cells. NAND gates G90 to G92 and flip flops F90 and F91 shown in FIG. 15A have delay characteristics similar to those shown in FIG. 6. In FIG. 15A, an inverter G93 and a level shifter G94 are also shown. It is assumed that the delay time of the inverter G93 in the case of a low-power cell is 0.4 ns, and that in the case of a high-speed cell is 0.2 ns. The level shifter G94 is a circuit for converting a signal having a small amplitude to a signal having a large amplitude, and its delay time is assumed as 0.4 ns. As shown in FIG. 15B, for example, when the NAND gate G91 is replaced by a high-speed cell, it becomes necessary to insert the level shifter G94 between the NAND gates G90 and G91. As shown in FIG. 15C, the delay time after inserting the level shifter G94 is 4.5 ns. The cell replacement operation is further performed and, finally, as shown in FIG. 15D, the delay time is set to 4.0 ns.

Figure 16:
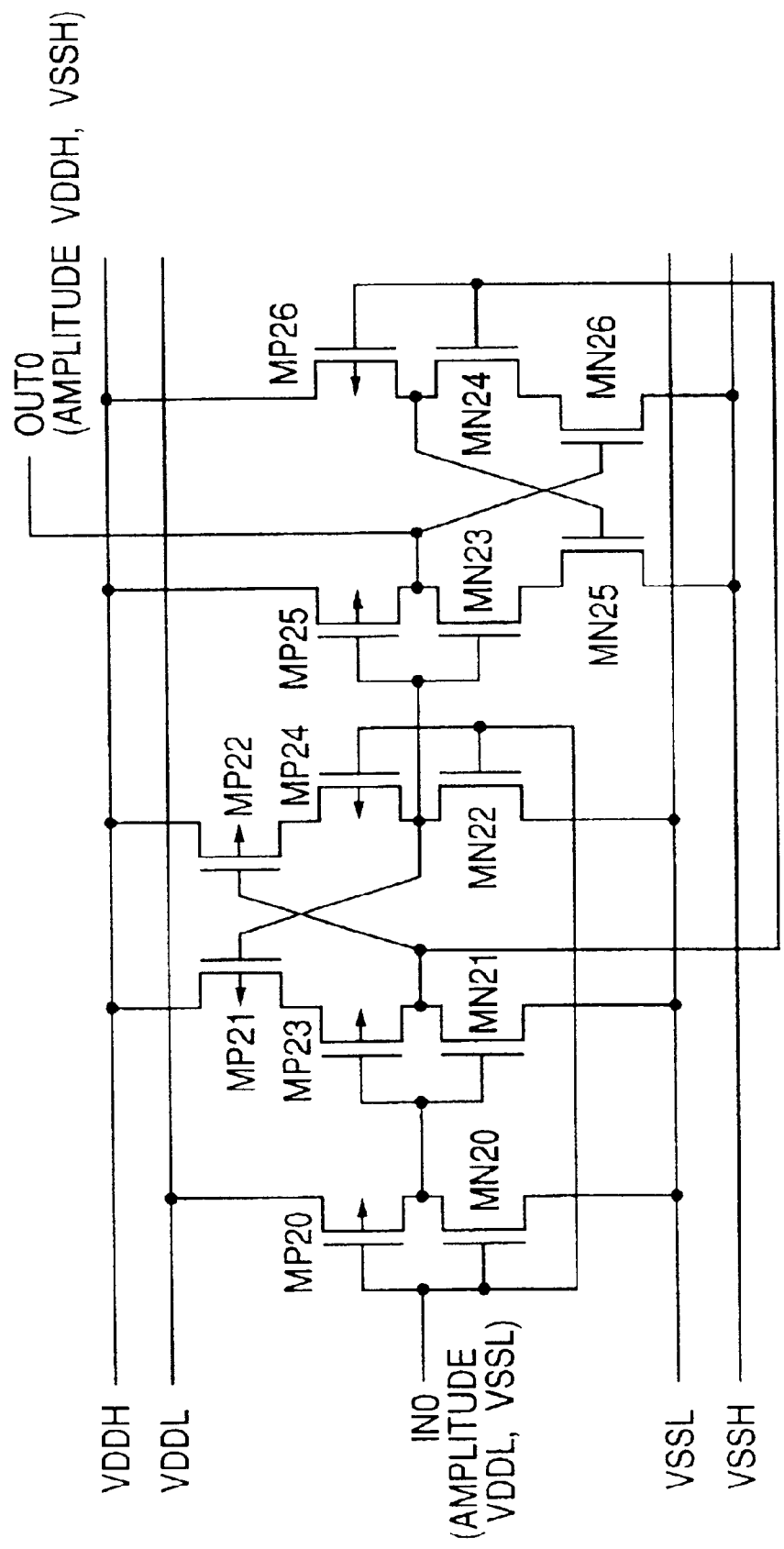
FIG. 16 is a circuit diagram showing an example of a level shifter which can be used for replacement with a high-speed cell.

FIG. 16 shows an example of the level shifter G94. An inverter constructed by the pMOS transistor MP20 and the nMOS transistor MN20 operates on VDDL and VSSL as the operation power source and inverts an input signal IN0. The input signal IN0 has a small amplitude of VDDL-VSSL. A circuit constructed by the pMOS transistors MP21 to MP24 and the nMOS transistors MN21 to MN22 operates on VDDH and VSSH as the operation power source, receives the input signal IN0 and an inversion signal of the input signal IN0, shifts the level of the high potential side of the signal amplitude from VDDL to VDDH. A circuit constructed by the pMOS transistor MP25 and MP26 and nMOS transistors nMOS transistors MN23 to MN26 operates on VDDH and VSSH as the operation power source, receives a complementary output signal having an amplitude of VSSL-VDDH from the preceding component, and shifts the level of the low potential side of the amplitude of the received signal from VSSL to VSSH. At a common drain electrode of the pMOS transistor MP25 and the nMOS transistor MN23, a signal OUT0 of which amplitude is level-shifted to VDDL-VDDH is obtained.

<Layout>

Figure 17:
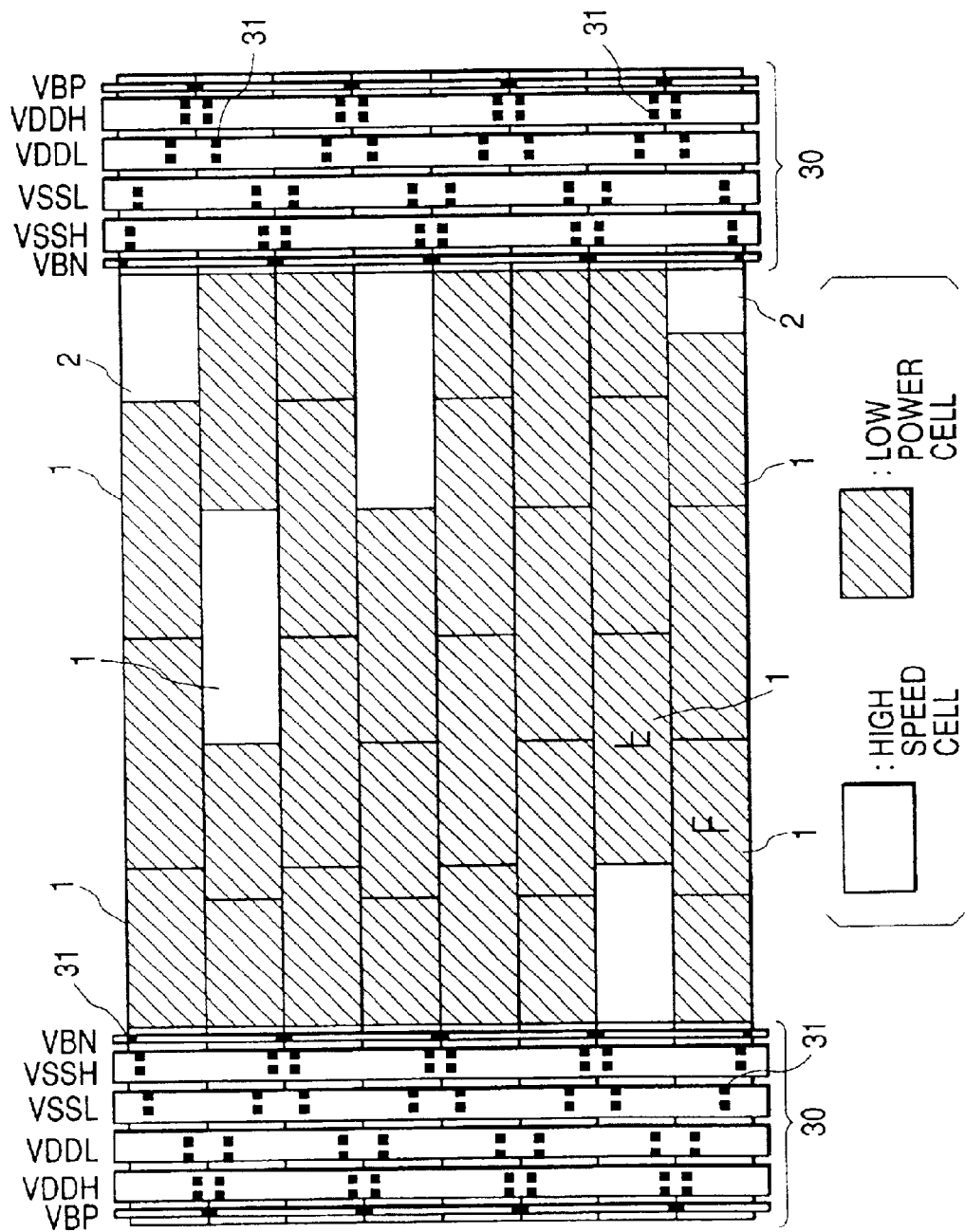
FIG. 17 shows a schematic layout pattern as an example of layout of a part of the semiconductor integrated circuit according to the invention.
Figure 18:
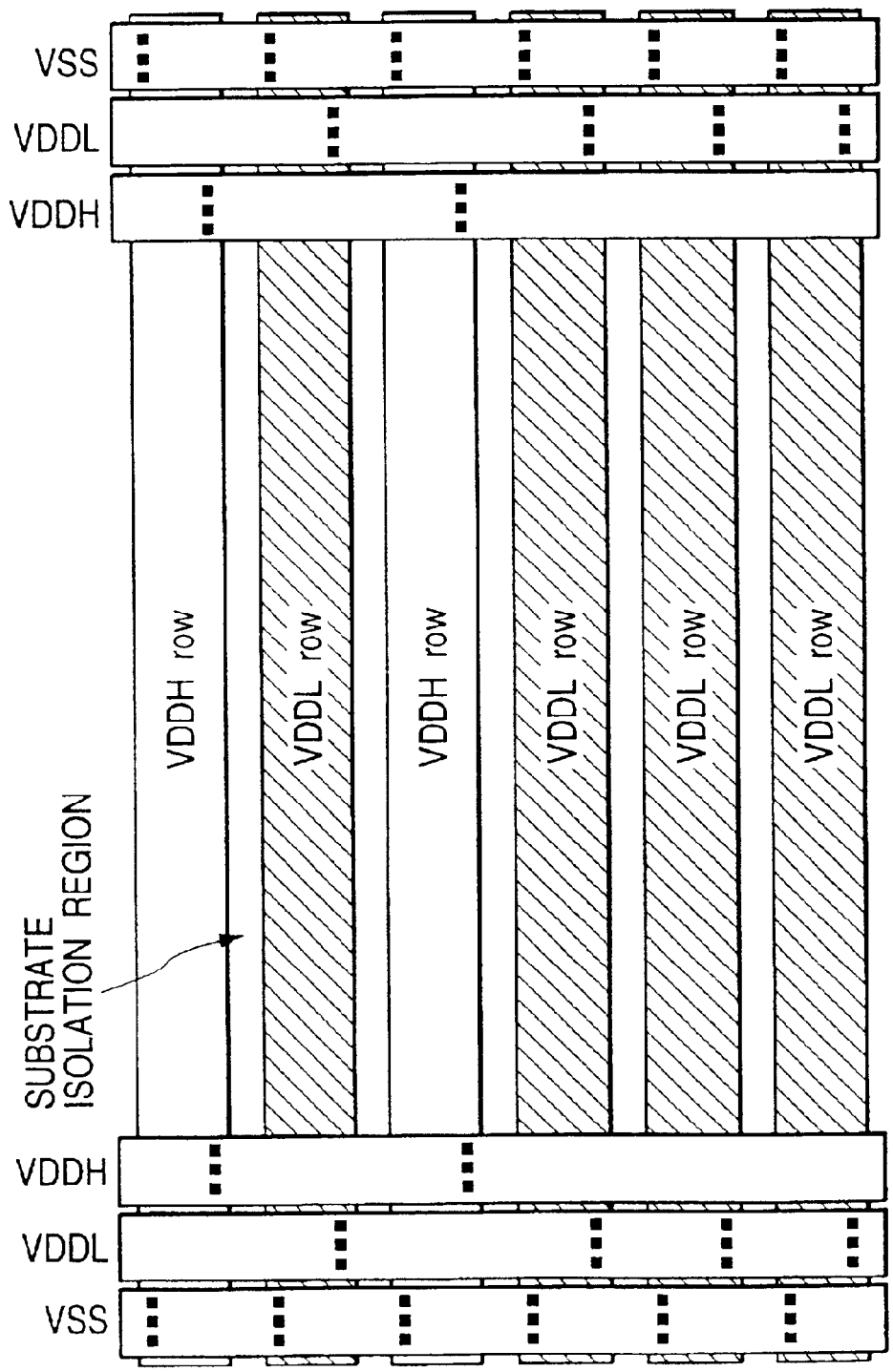
FIG. 18 shows a layout pattern as a comparative example of FIG. 17, according to a technique in which a substrate potential is not commonly used.

FIG. 17 schematically shows an example of layout of a part of the semiconductor integrated circuit according to the invention. In the diagram, reference numeral 30 denotes a main power source line of VBP, VDDH, VDDL, VSSL, VSSH, and VBN, 1 indicates low-power cells, and 2 expresses high-speed cells. In representative two cells in the low-power cells 1, the character "F" is written to show the direction of the cells. The directions of neighboring cells in the vertical direction of the drawing are different from each other. Although interconnections of the cells are not shown for simplicity of the drawing, a contact point between each of the power lines in the main power line 30 and a not-shown power line between cells is indicated by reference numeral 31. As already described in FIG. 1, in the high-speed cell 2 and the low-power cell 1 according to the invention, the substrate potential of the pMOS transistor and the nMOS transistor is commonly used. Consequently, it is possible to lay out the high-speed cells 2 and the low-power cells 1 so as to mixedly exist in common n-type and p-type well regions like tiles. In the case of applying the technique of the second literature in which the substrate potential is not commonly used, as shown in a comparative example of FIG. 18, a substrate isolating region for electrically isolating well regions even of the same conduction type has to be provided between a cell forming region (VDDHrow) for a high-speed logic circuit using a pair of power sources VDDH and VSS having a large potential difference as an operation power source and a cell forming region (VDDLrow) for forming a low-power logic circuit using a pair of power sources VDDL and VSS having a small potential difference as an operation power source. In the case of the present invention shown in FIG. 17, it is unnecessary to provide the substrate isolating region. A desired logic circuit can be laid out by using a small area. In the case of the comparative example of FIG. 18, although not particularly shown, when cells which do not share the substrate potential are arranged in the same row, the well region has to be divided into small regions for cells of different substrate potentials to assure the isolation regions.

Figure 19A:
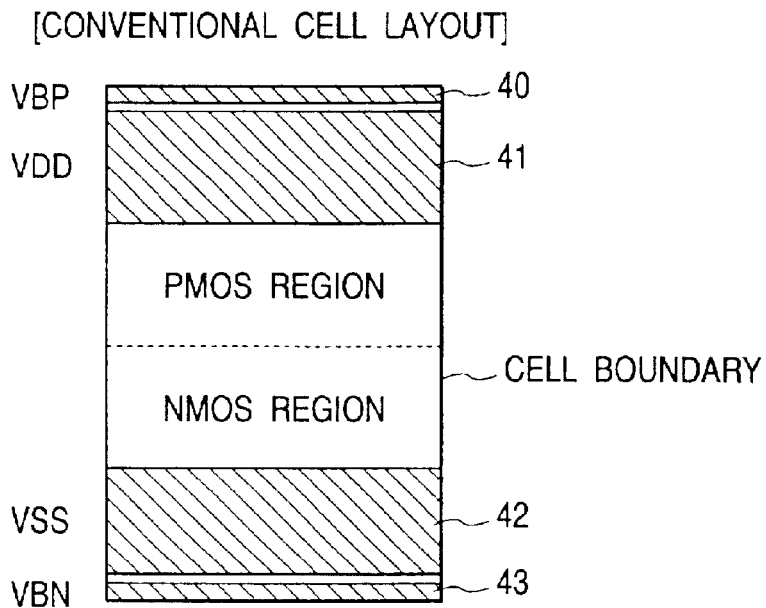
FIGS. 19A and 19B show schematic layout patterns of power source interconnections in a cell.
Figure 19B:
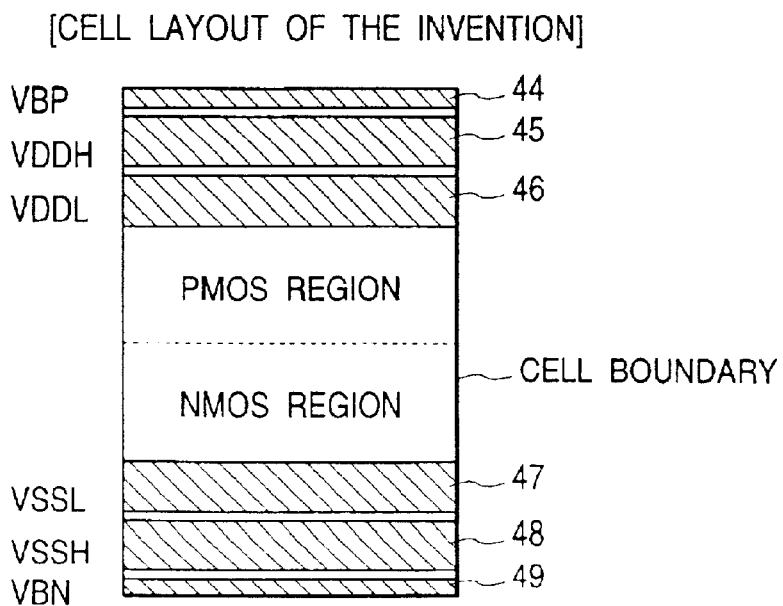

FIGS. 19A and 19B schematically show power lines in a cell. FIG. 19A shows an example of a conventional cell layout having a pair of a power line interconnection and a ground line in a cell. Shown in FIG. 19A are a metal line 40 for transmitting the substrate potential VBP of a pMOS transistor, a metal line 41 for transmitting the power source potential VDD, a metal line 42 for transmitting the power source potential VSS, and a metal line 43 for transmitting the substrate potential VBN of an nMOS transistor. FIG. 19B shows an example of a layout of a cell such as a high-speed cell or low-power cell according to the invention. Shown in FIG. 19B are a metal line 44 for transmitting the substrate potential VBP of a pMOS transistor, a metal line 45 for transmitting a power source potential VDDH, a metal line 46 for transmitting the power source potential VDDL, a metal line 47 for transmitting the power source potential VSSL, a metal line 48 for transmitting the power source potential VSSH, and a metal line 49 for transmitting the substrate potential VBN of the nMOS transistor. In the case of a high-speed cell, the source of a MOS transistor is connected to the metal lines 45 and 48. In the case of a low-power cell, the source of a MOS transistor is connected to the metal lines 46 and 47. By using a layout in which a plurality of power lines are arranged in a single cell as described above, the layout in which high-speed cells and low-power cells mixedly exist as shown in FIG. 17 is simplified. With respect to the width of the power line 41 in the conventional example of FIG. 19A and that of the power lines 45 and 46 in the layout according to the invention of FIG. 19B, since the invention provides the function of decreasing the power consumption of a circuit as described above, it is unnecessary to make the total of the widths of the power lines 45 and 46 wider than the width of the power line 41. Therefore, the cell size according to the layout of the invention does not become larger than that according to the conventional layout.

Figure 20A:
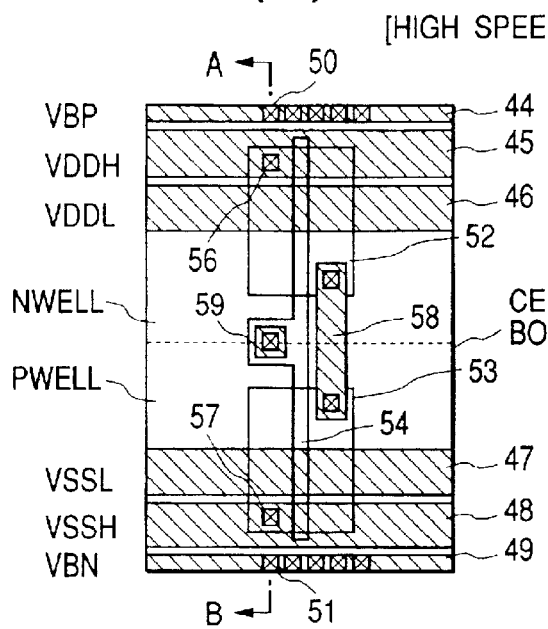
FIGS. 20A and 20B show a layout pattern of an example of a high-speed cell having the inverter logic described in FIG. 1.
Figure 20B:
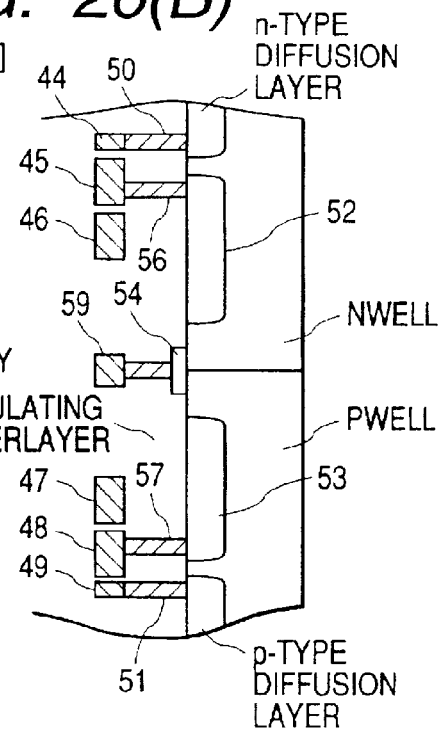

FIGS. 20A and 20B show an example of the layout of the high-speed cell 2 having the inverter logic described in FIG. 1. FIG. 20A is a plan view and FIG. 20B is a cross sectional view taken along the line A–B of FIG. 20A. Shown in FIGS. 20A and 20B are the metal line 44 for transmitting the substrate potential VBP of a pMOS transistor, the metal line 45 for transmitting the power source potential VDDH, the metal line 46 for transmitting the power source potential VDDL, the metal line 47 for transmitting the power source potential VDDL, the metal line 48 for transmitting the source potential VSSL, and the metal line 49 for transmitting the substrate potential VBN of an nMOS transistor. Also illustrated are a diffusion layer 52 of the pMOS transistor, a diffusion layer 53 of the nMOS transistor, a gate electrode 54 of a MOS transistor made of polysilicon, a through hole 50 for connecting the metal line 44 and an n-type well region NWELL, a through hole 51 for connecting the metal line 49 and a p-type well region PWELL, a through hole 56 for connecting the metal line 45 and the diffusion layer 52, a through hole 57 for connecting the metal line 49 and the diffusion layer 53, an input electrode 59 of an inverter circuit, and an output electrode 58 of the inverter circuit.

Figure 21A:
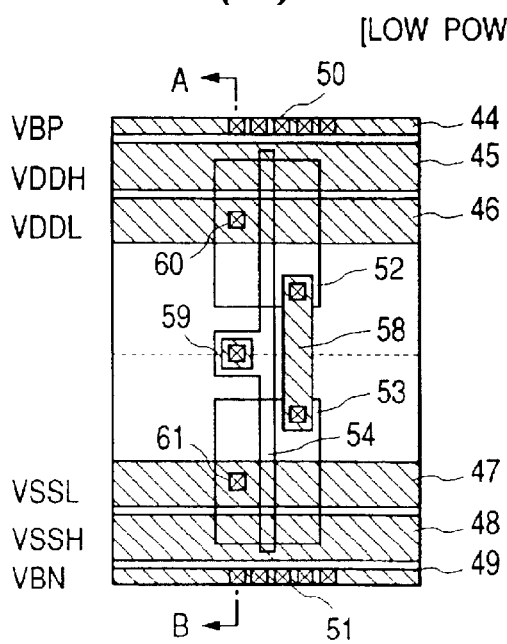
FIGS. 21A and 21B show a layout pattern of an example of a low-power cell having the inverter logic described in FIG. 1.
Figure 21B:
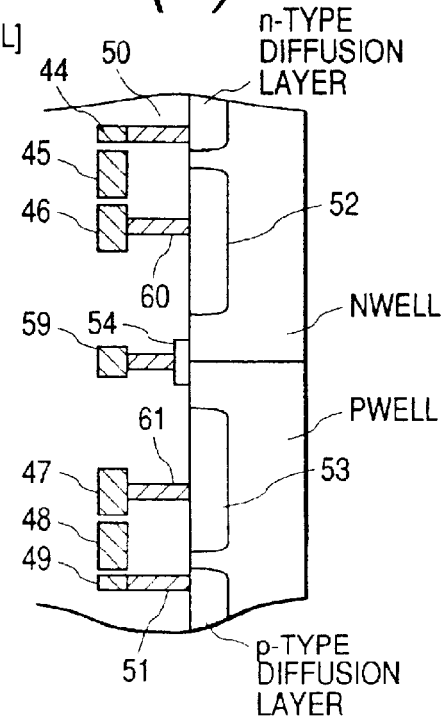

FIGS. 21A and 21B show an example of the layout of the low-power cell 1 having the inverter logic described in FIG. 1. FIG. 21A is a plan view and FIG. 21 is a cross sectional view taken along line A-B of FIG. 21A. FIGS. 21A and 21B are different from FIGS. 20A and 20B with respect to the point that the diffusion layer 52 is connected to the metal line 46 via a through hole 60, and the diffusion layer 54 is connected to the metal line 47 via a through hole 61. The other configuration is the same as that of FIGS. 20A and 20B. In short, as obviously understood by comparing FIGS. 20A and 20B with FIGS. 21A and 21B, the different points are only the positions of the through holes 56 and 60 and the positions of the through holes 57 and 61. As described above, since there is no difference between the external shape of the cell and the terminal positions, the number of manufacturing steps of a cell can be reduced. In step 14 in FIG. 8 and step 14A in FIG. 14 of replacing the low-power cell 1 with the high-speed cell 2, the replacement can be performed without moving the cells once laid out. Consequently, since the interconnections of cells do not have to be moved, the number of steps of disposing and interconnecting cells can be also reduced.

<Semiconductor Integrated Circuit>

Figure 22:
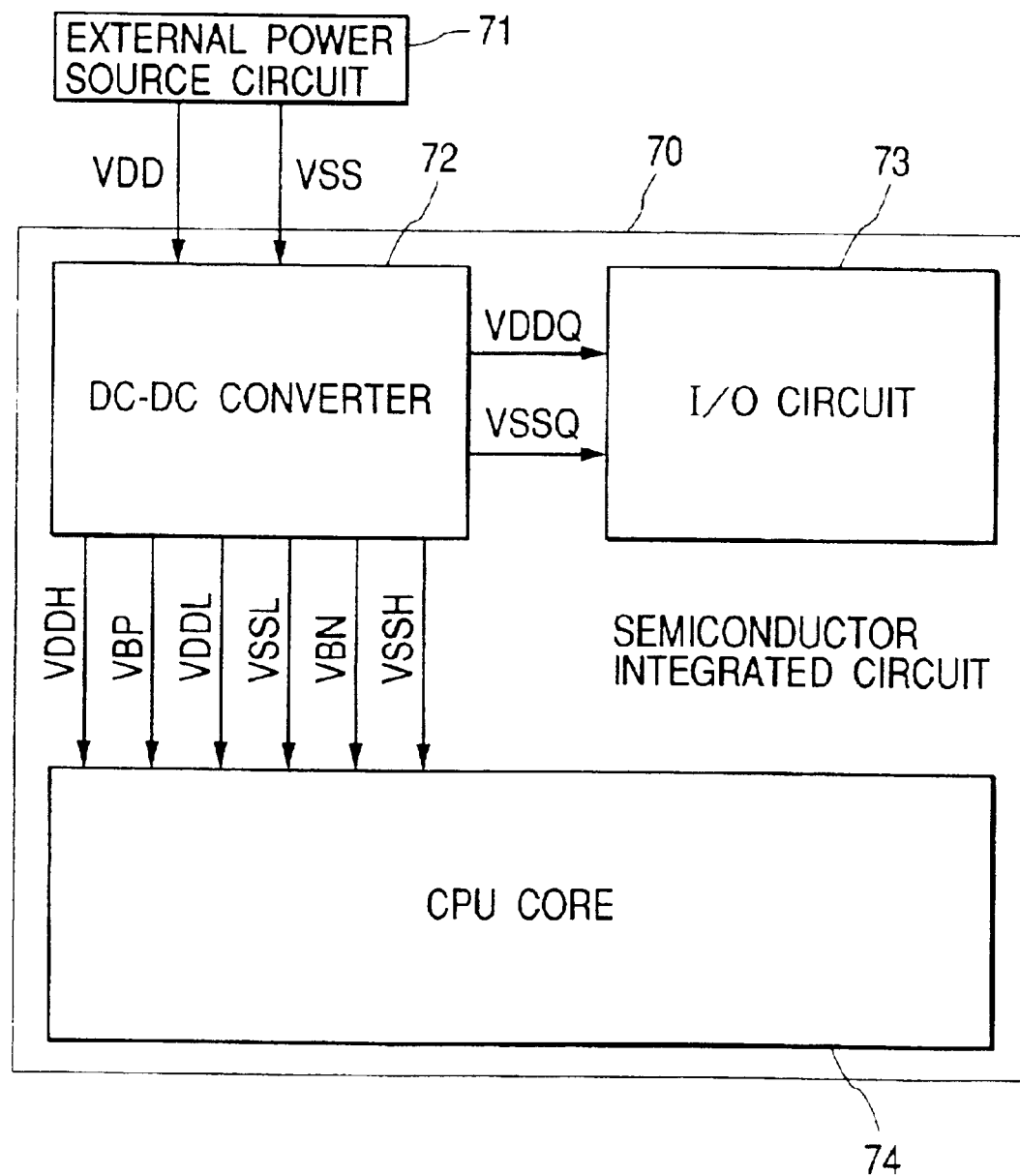
FIG. 22 is a block diagram mainly showing a power source system of a semiconductor integrated circuit to which the invention is applied.

FIG. 22 mainly shows a power system of the semiconductor integrated circuit to which the invention is applied. In the example, a semiconductor integrated circuit 70 has a DC-DC converter 72, a CPU core 74, and an input/output circuit (I/O circuit) 73 which are on a semiconductor chip. The I/O circuit 73 is a circuit such as a bus buffer circuit interfaced with an external address bus or data bus, or an analog input/output circuit such as an A/C converter or D/A converter. The CPU core 74 includes a command control unit for fetching a command and decoding the command, and an execution unit for executing an computing process in accordance with the command decoding result by the command control unit. Reference numeral 71 denotes a power source circuit on the outside of the chip. The external power source circuit 71 is provided for a circuit substrate on which the semiconductor integrated circuit 70 is mounted, and supplies a single pair of powers (VDD and VSS) to the semiconductor integrated circuit 70. For example, VDD is equal to 5V and VSS is equal to 0V. The DC-DC converter 72 for receiving the single pair of powers (VDD and VSS) generates four sets of powers (VDDQ, VSSQ), (VDDH, VSSH), (VDDL, VSSL), and (VBP, VBN). Although not limited, VDDQ is equal to 3.3V, VSSQ is equal to 0V, VDDH is equal to 2.5V, VSSH is equal to 0V, VDDL is equal to 2.0V, VSSL is equal to 0.5V, VBP is equal to 2.25V, and VBN is equal to 0.25V. The powers (VDDQ, VSSQ) are supplied to the I/O circuit 73 and the rest is supplied to the CPU core 74. In the example of FIG. 22, since it is sufficient to supply only one pair of external powers (VDD, VSS) to the semiconductor integrated circuit 70, the usability is excellent.

Figure 23:
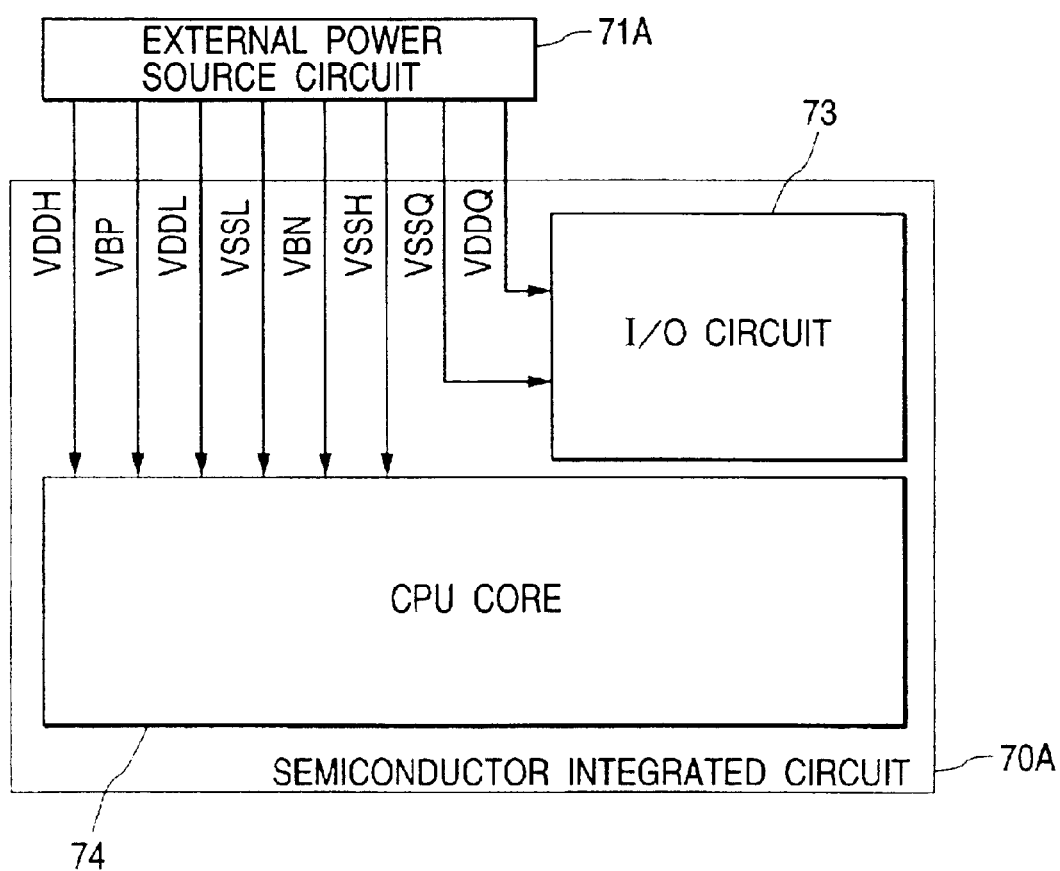
FIG. 23 is a block diagram mainly showing a power source system of another semiconductor integrated circuit to which the invention is applied.

FIG. 23 shows mainly another power system of the semiconductor integrated circuit to which the invention is applied. FIG. 23 is different from FIG. 22 with respect to the point that a semiconductor integrated circuit 70A does not have therein the DC-DC converter 72 but receives the four sets of powers (VDDQ, VSSQ), (VDDH, VSSH), (VDDL, VSSL), and (VBP, VBN) generated from an external power source 71A and uses them as operation power sources. In the case of the example, it is unnecessary to provide a DC-DC converter on the chip. Consequently, the chip area of the semiconductor integrated circuit can be reduced only by the amount corresponding to the DC-DC converter.

Figure 24:
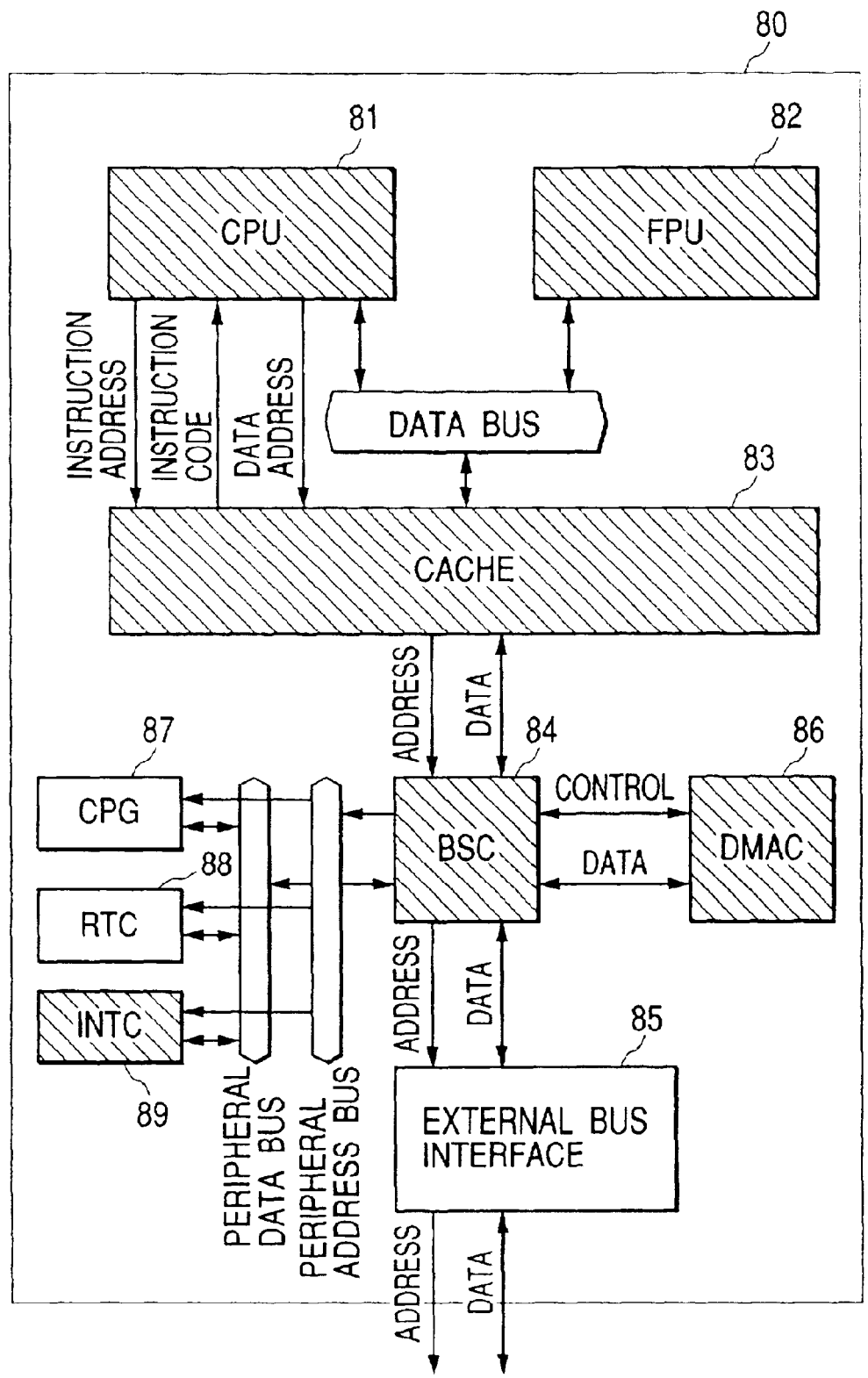
FIG. 24 is a block diagram of a microprocessor as an example of a semiconductor integrated circuit device to which the invention is applied.

FIG. 24 shows a microprocessor as an example of the semiconductor integrated circuit device to which the invention is applied. The microprocessor shown in the diagram is formed on a single semiconductor substrate or semiconductor chip made of single crystal silicon or the like by, for example, the CMOS integrated circuit fabricating technique.

A microprocessor 80 has a CPU (Central Processing Unit) 81 having the instruction control unit and the execution unit, and an FPU (floating point unit) 82 specialized for floating point arithmetic. The CPU 81 has an addressing function for instruction access and operand access. Addressing to data loaded to the FPU 82 and data stored in the FPU 82 is performed by the CPU 81.

A cache unit (CACHE) 83 has a data cache memory, an instruction cache memory, and an MMU (Memory Management Unit) (which are not shown). The MMU has an address converting function of converting a logical address of the CPU 81 to a physical address, and has an entry for address conversion in an address conversion buffer (TLB) of an associative memory structure. The instruction cache memory and the data cache memory have an associative memory structure of holding instructions and data around an instruction and data of an address used recently out of instructions and data held by a main memory (not shown). One side of the cache unit 83 is connected to the CPU 81 and the FPU 82 and the other side is connected to a bus state controller (BSC) 84.

The bus state controller 84 controls necessary external bus access and access to a periphery circuit when a cache error, a TLB error, or the like in the cache unit 83 occurs. The bus state controller 84 has, as peripheral circuits, a clock pulse generator (CPG) 87, a timer counter (RTC) 88, and an interrupt controller (INTC) 89. To the bus state controller 84, a direct memory access controller (DMAC) 86 is connected. When the CPU 81 initially sets data transfer control conditions in the DMAC 86, the DMAC 86 starts a control of transferring data to/from the peripheral circuits and the outside via the bus state controller 84. The bus state controller 84 is connected to the external bus via an external bus interface 85.

In the microprocessor 80 shown in FIG. 24, the above-described means of constructing a logic circuit by using both the first and second logic gates 1 and 2 commonly using the substrate potential is employed for the CPU 81, FPU 82, CACHE 83, BSC 84, DMAC 86, and INTC 89. For example, in the CPU 81, signal paths for a logic of decoding an instruction code and issuing an instruction address, a cache memory access in the cache unit 83, calculation of a sum of product in the FPU 82, and the like are apt to become critical, a circuit including them is constructed by mixedly using the first and second logic gates 1 and 2 which commonly use the substrate potential, thereby enabling both improved data processing performance by the microprocessor 80 and lower power consumption to be realized.

<Another Mode of sharing Substrate Potential>

Figure 25:
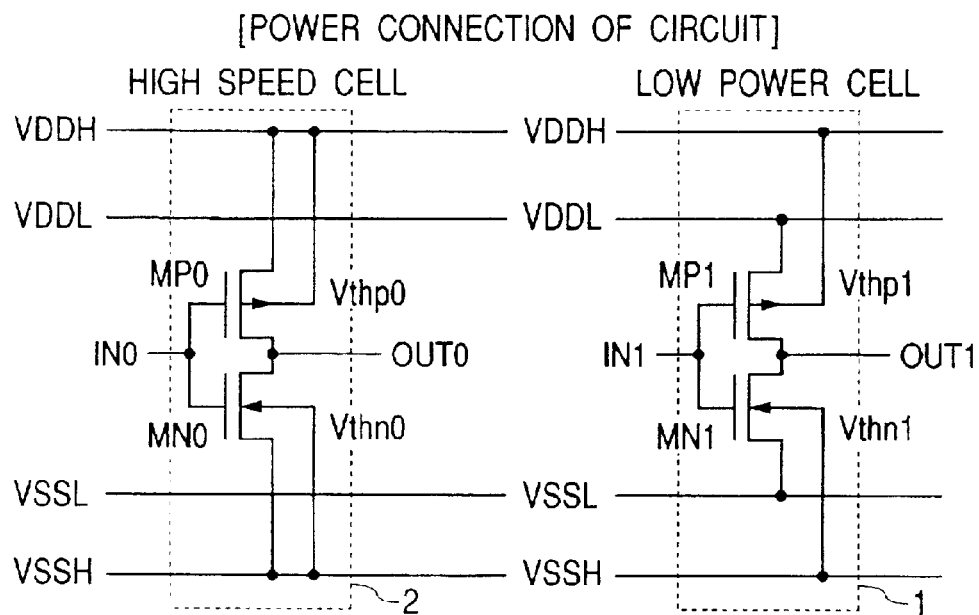
FIG. 25 is a circuit diagram showing another example of a first logic gate and a second logic gate of a semiconductor integrated circuit according to the invention.
Figure 26:
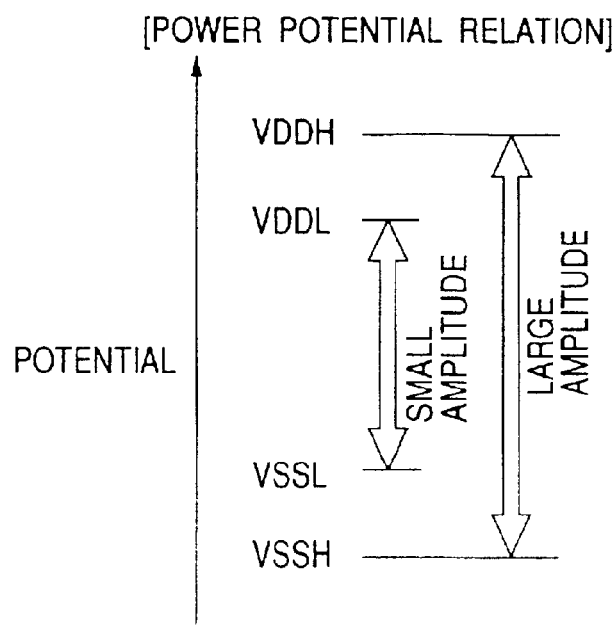
FIG. 26 is a diagram for explaining the relation of potentials in FIG. 15.

FIG. 25 shows another example of the first and second logic gates of the semiconductor integrated circuit according to the invention. In FIG. 1, the substrate potential VBP of the pMOS transistors MP0 and MP1 and the substrate potential VBN of the nMOS transistors NM0 and MN1 are prepared separate from the powers VDDH, VDDL, VSSH, and VSSL. In the example of FIG. 25, VDDH also serves as VBP, and VSSH also serves as VBN. As shown in FIG. 26, the order of the potentials, from the highest to lowest, is VDDH, VDDL, VSSH, and VSSH. In this case, a substrate bias is not applied to the MOS transistors MP0 and MN0, so that the threshold voltage is relatively low, and high speed operation is possible. Since reverse biases of only VDDL-VDDH and VSSL-VSSH are applied to the transistors MP1 and MN1, respectively, the threshold voltage rises, and the leak current decreases. The high-speed cell 2 of the inverter type as an example of the second logic gate 2 in FIG. 25 has an output amplitude of VDDH-VSSH, so that the operation is performed at high speed. The low-power cell 1 of the inverter type as an example of the first logic gate 1 has an output amplitude of VDDL-VSSL, so that the power is low. By using the high-speed cell 2 for only a critical path and using the low-power cell 1 to other paths, high-speed operation and low-power operation can be simultaneously realized.

Further, as shown in FIG. 25, the VBP and VBN lines are not provided, so that the layouts shown in FIG. 17 and FIGS. 19 to 21 can be further simplified. The power source circuits shown in FIGS. 22 and 23 can be also simplified.

In the example of FIG. 25 as well, the designing methods described in FIGS. 8 and 14 can be applied. For replacement with a high-speed cell, in a manner similar to the above, the flip flop with the level shifting function in FIG. 12 and the level shifter in FIG. 16 can be used.

Figure 27:
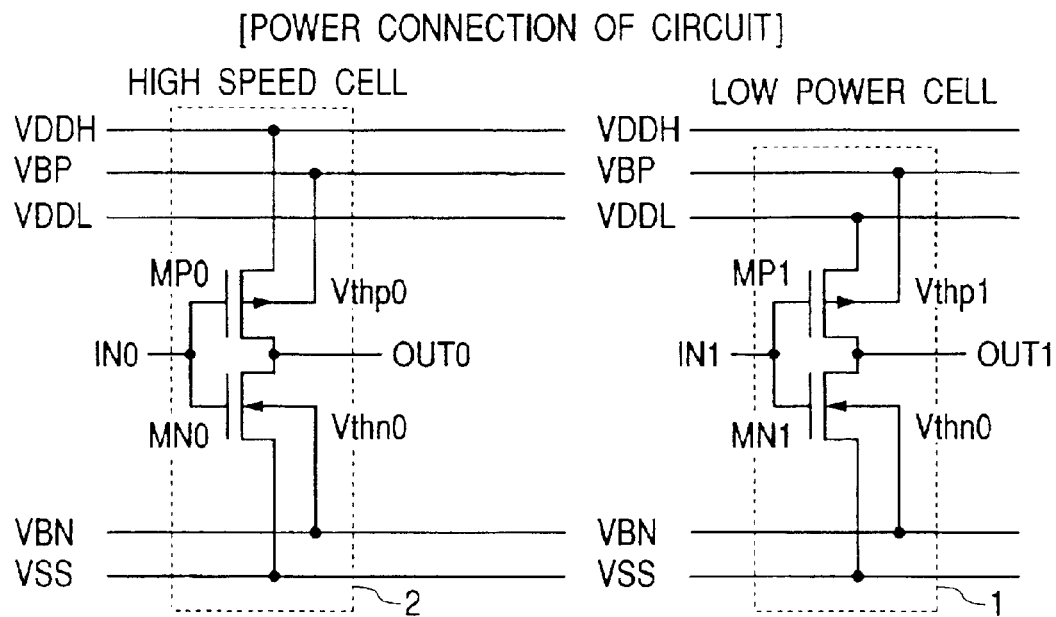
FIG. 27 is a circuit diagram showing further another example of the first and second logic gates of the semiconductor integrated circuit according to the invention.
Figure 28:
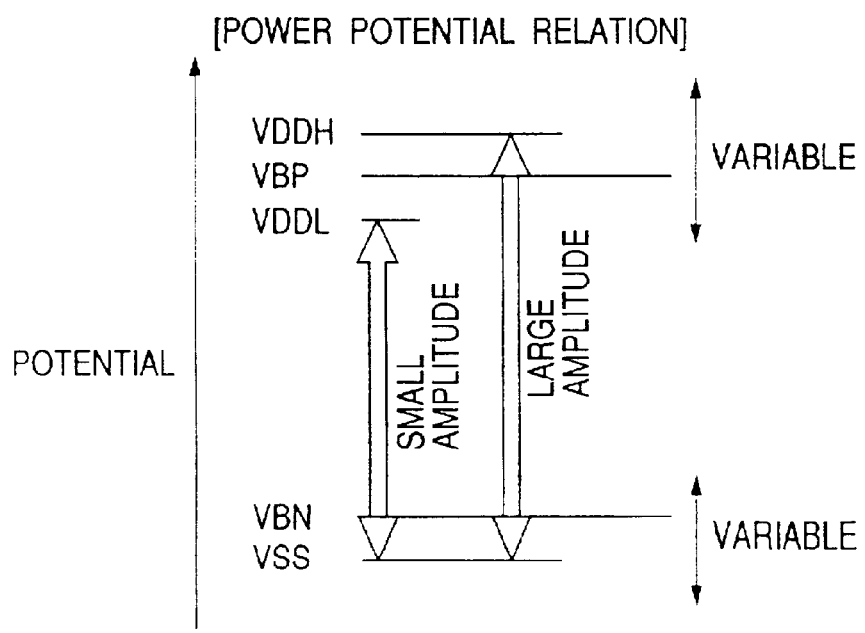
FIG. 28 is a diagram for explaining the relation of potentials in FIG. 27.

FIG. 27 shows further another example of first and second logic gates of the semiconductor integrated circuit according to the invention. In the example of the drawing, one kind of the power potential VSS on the ground side is used. As shown in FIG. 28, the order of the potentials, from the highest to lowest, is VDDH, VBP, VDDL, VBN, and VSS. An output amplitude of the high-speed cell 2 of the inverter type as an example of the second logic gate 2 is VDDH-VSS, and that of the low-power cell 1 of the inverter type as an example of the first logic gate 1 is VDDL-VSS. The former one is suitable for high-speed operation, and the latter one is suitable for low-power operation. The nMOS transistors MN0 and MN1 have the common source potential VSS and the common substrate potential VBN, so that they have the same threshold voltage of Vthn0. On the other hand, the substrate bias is applied in different ways to the pMOS transistors MP0 and MP1. Consequently, the pMOS transistors MP0 and MP1 have different threshold voltages Vthp0 and Vthp1. The threshold voltage of the pMOS transistor MP1 is higher than the other. It is said that the subthreshold leak of a MOS transistor is proportional to the gate width of the MOS transistor. Usually, in a CMOS circuit, the gate width of the pMOS transistor having weaker driving force is set to be wider than that of the nMOS transistor. It is considered that the subthreshold leak of the pMOS transistor is larger than the other. Paying attention to this point, the example of FIG. 27 aims at producing an effect of reducing the leak current of the PMOS transistor MP1. In this case, obviously, the layout examples shown in FIG. 17 and FIGS. 19 to 21 and examples of the power source circuit shown in FIGS. 22 and 23 can be further simplified.

Figure 29:
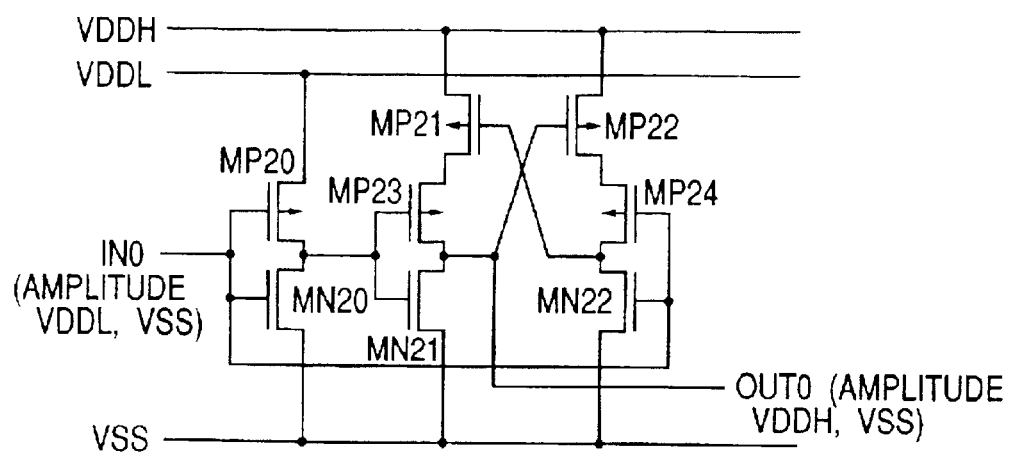
FIG. 29 is a circuit diagram showing a level shifter which can be inserted at the time of replacement with a high-speed cell in the power source configuration of FIG. 27.

To the example of FIG. 27 as well, the designing methods described in FIGS. 8 and 14 can be applied. With respect to the replacement by a high-speed cell, in a manner similar to the above, the flip flop with the level shifting function of FIG. 12 and the level shifter in FIG. 29 can be used. The level shifter in FIG. 29 is obtained by eliminating the MOS transistors MP25, MP26, and MN23 to MN26 from the level shifter of FIG. 16, the ground potential VSS also serves as the low potential side power source so as to increase the level of the input amplitude VDDL-VSS to the output amplitude VDDH-VSS.

<Program Recording Medium>

Figure 30:
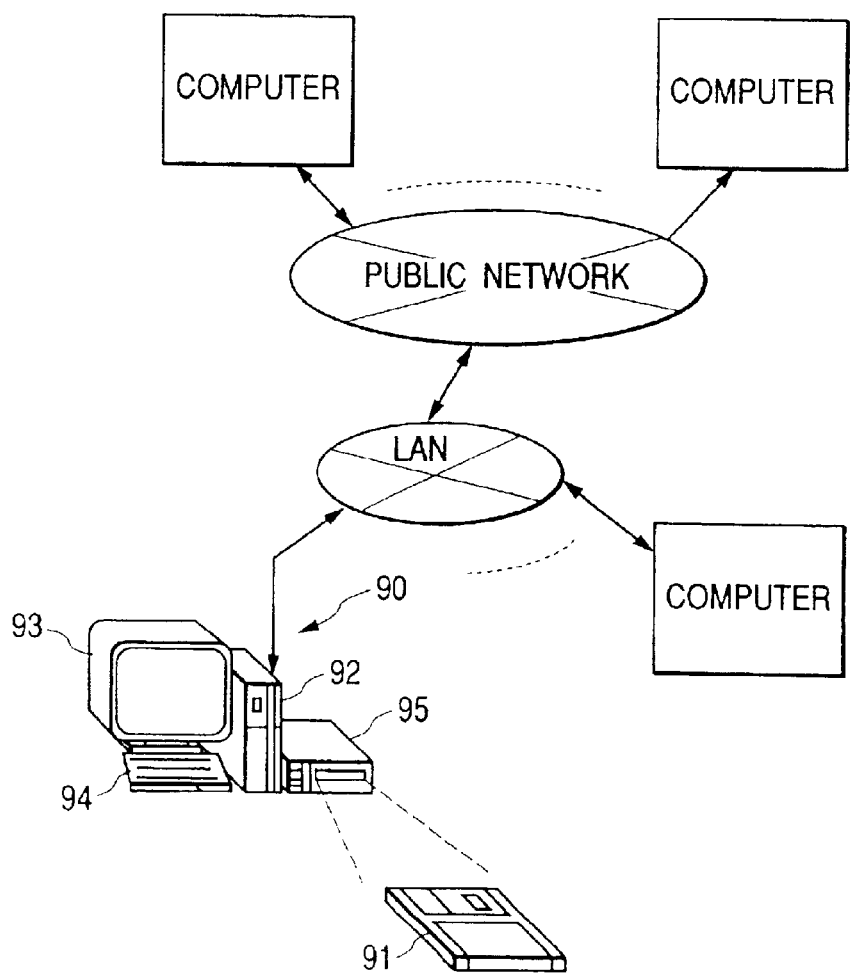
FIG. 30 is a block diagram showing an example of a computer such as an engineering workstation used for designing a semiconductor integrated circuit.

For designing the semiconductor integrated circuit by the designing methods described in FIGS. 8 and 14, a program for specifying the processes can be used. The design support program is provided by being recorded on a recording medium 91 such as an FD (floppy disk), CD-ROM (compact disc-ROM) disk, or an MOS (magneto-optics) disk so as to be read by a computer 90 as shown in FIG. 30. The program is an object code obtained by compiling and debugging a source program described in the C language or the like of the processes in the steps 11 to 15 of the flowchart shown in FIG. 8 or 14 so as to be adapted to the computer 90. Since specific processes to be performed by the program have been already described above, their description will not be repeated here. The processes by the program are, although not limited, performed according to commands entered by the operator via a graphic user interface. The program supports a process of determining whether signal propagation delay time in a signal path in a logic circuit designed by using the first logic gate 1 achieves the target delay time or not and replacing one or a plurality of first logic gates 1 included in a signal path of which signal propagation delay time does not achieve the target delay time with the second logic gate(s) 2. By reading such a program from the recording medium 91 and using it by the computer 90, a semiconductor integrated circuit can be easily designed by the designing method.

<Design Data Recording Medium>

At the time of designing a semiconductor integrated circuit by the design method described in FIG. 8 or 14 or the like, design data which can be read by a computer can be used. Such design data includes, for example, first mask pattern data for determining a figure pattern to form the first logic gate 1 on a semiconductor chip as shown by FIGS. 21A and FIG. 21B, and second mask pattern data for determining a figure pattern for forming the second logic gate 2 on the semiconductor chip as shown in FIGS. 20A and 20B. The mask pattern data is not limited to the inverter logic but may be proper circuit pattern data such as NAND or NOR. The design data is provided by being recorded on the recorded medium 91 so as to be read by the computer 90. The mask pattern data is, for example, drawing data for forming a mask pattern. The mask pattern data is coordinate data for specifying a figure pattern for each of circuit forming layers such as a semiconductor layer (semiconductor region), a wiring layer, and an insulating layer on a semiconductor chip. It is, for example, data in a stream format called GDS2. The data is read by the computer 90 of a mask designing apparatus or the like constructed by an engineering workstation so as to generate a pattern of a photomask. The design data is data verified with respect to functions and performances in a manner similar to data of a hardware IP module. Consequently, the functions and performances of circuits specified by the data are already stabilized. By using such design data for designing an integrated circuit, higher reliability on the functions and performances can be guaranteed by the smaller number of designing steps.

The design data may be data described in a hardware description language such as, what is called a software IP module. Specifically, the design data recorded on the design data recording medium 91 so as to be read by the computer 90 includes first function description data for determining the functions of the first logic gate 1 and second function description data for determining the functions of the second logic gate 2. The function description data is data describing the functions in a computer language such as HDL. Like data of the software IP module, stability of the functions and performances of a circuit specified by the data is not so guaranteed as compared with the case of the hardware IP module. On the other hand, the degree of freedom in designing related to the driving capability of the circuit or the like is guaranteed. By using the function description data for designing the integrated circuit, while assuring the degree of freedom in designing, a required figure pattern of a circuit can be designed finally.

The computer 90 such as an engineering workstation, a personal computer, or a design apparatus used for designing a semiconductor integrated circuit is constructed by, as shown in FIG. 30, connecting peripheral devices typified by a display 93, a keyboard 94, and a disk driver 95 to the computer body 92 on which a processor board on which a processor, a memory, and the like are mounted, and various interface boards are mounted. Design data such as IP module data is stored in a recording medium 91. The recording medium 91 is, although not limited, inserted to the disk drive 95, and the IP module data recorded on the disk drive 95 is read by the computer body 92. For example, when the read data is description data described in the HDL, the computer 90 decodes the data and performs a process. In order to decode the data and perform a process, the computer 90 executes a specific program. The computer 90 may be a distributed processing system. For example, disk access, layout computation, and man-machine interface are processed by separate computers connected to a network such as LAN, and process results may be collected and used. When the capacity of IP module data as the design data increases and becomes impossible to be stored in a single recording medium 91, the IP module data may be stored in a plurality of recording media. Obviously, it is also possible to preliminarily divide the IP module data so as to be stored in a plurality of recording media and to store the data into the plurality of recording media. Such IP module data is stored in a disk drive or the like of a computer of a vender as a provider of the data. The user who wishes to use the IP module data can use it through a network in accordance with a predetermined procedure.

Although the present invention achieved by the inventor has been described specifically on the basis of the embodiment, obviously, the invention is not limited to the embodiment but can be variously modified within the range not departing from the gist.

For example, the relation between the power source potential and the substrate potential is not limited to the modes of FIGS. 1, 25, and 27. For example, when the first priority is placed on the high-speed operation in the power source pair as shown in FIG. 25, it is possible to apply the substrate bias to the second logic gate but not to the first logic gate. Each of the first and second logic gates is not limited to the logic such as the inverter or NAND but may be a proper logic. Further, the semiconductor integrated circuit can be widely used not only for a microprocessor or microcomputer on which a CPU is mounted but also a clock synchronous type memory such as a synchronous DRAM, a DRAM mounted LSI such as a graphic controller, and the like. The semiconductor integrated circuit is not limited to a CMOS circuit but may be a bi-CMOS circuit or the like. In the above description, the design data and the program data is stored in the single recording medium 91. Obviously, the design data and the program data may be recorded on separate recording media and provided.

The circuit portion having the relation between the power source potential and the substrate potential described in the foregoing embodiment may be a part of a semiconductor integrated circuit. On the other part, a substrate potential control and a power supply control for low power consumption are performed. The controls may be also performed without using the method of reducing the power consumption, or a combination of the controls may be performed. In this case, obviously, the circuit portion operating in almost all of the period in which the operating frequency is relatively high and the semiconductor integrated circuit operates has the relation between the power source potential and the substrate potential. On the circuit portion having a relatively low operating frequency or operating intermittently, the substrate potential control and the power supply control may be performed.

The effects obtained by the preferred embodiment of the invention disclosed in the application will be briefly described as follows.

A semiconductor integrated circuit realizing high-speed and low-power operation from the viewpoint of an operation power source voltage and a substrate bias voltage can be provided.

A semiconductor integrated circuit without an overhead area, realizing improved operating speed and, simultaneously, reduced power consumption in an active mode and reduced power consumption in a standby mode can be provided.

The operating speed of the semiconductor integrated circuit is improved, the power consumption in the active mode and that in the standby mode are reduced and, further, the efficiency of designing of a semiconductor integrated circuit without an overhead area can be increased.

We claim:

1. A semiconductor integrated circuit comprising:
   a first logic gate using, as an operation power source in an active operation mode, a first pair of potentials having a relatively small potential difference from a first pair of potential lines; and
   a second logic gate using, as an operation power source in said active operation mode, a second pair of potentials having a relatively large potential difference from a second pair of potential lines,
   wherein a substrate potential of MIS transistors is commonly used by said first and second logic gates, and
   wherein said first logic gate and said second logic gate each have two pairs of potential line portions, respectively including portions of said first pair of potential lines and portions of said second pair of potential lines, and further have a portion of at least one substrate potential line which supplies said substrate potential.

2. A semiconductor integrated circuit according to claim 1, wherein said first logic gate includes an MIS transistor to which a substrate bias is applied in a reverse direction by a substrate potential, and said logic gate includes an MIS transistor to which a substrate bias is applied in a forward direction by said substrate potential.

3. A semiconductor integrated circuit according to claim 1, wherein said first logic gate includes a p-channel type MIS transistor and an n-channel type MIS transistor to which substrate biases are applied in a reverse direction by respective substrate potentials, and said second logic gate includes a p-channel type MIS transistor and n-channel type MIS transistor to which substrate biases are applied in a forward direction by the respective substrate potentials.

4. A semiconductor integrated circuit according to claim 1, wherein said first logic gate includes a p-channel type MIS transistor to which a substrate bias is applied in a reverse direction by a substrate potential, and said second logic gate includes a p-channel type MIS transistor to which a substrate bias is applied in a forward direction by said substrate potential.

5. A semiconductor integrated circuit according to claim 1, wherein said first logic gate includes a p-channel type MIS transistor and an n-channel type MIS transistor to which substrate biases are applied in a reverse direction by respective substrate potentials.

6. A semiconductor integrated circuit according to claim 1, wherein said first and second logic gates are supplied with said first and second potential pairs, respectively, as power sources in a standby mode.

7. A semiconductor integrated circuit comprising:
a first logic gate using, as an operation power source in an active operation mode, a first pair of potentials having a relatively small potential difference from a first pair of potential lines; and
a second logic gate using, as an operation power source in said active operation mode, a second pair of potentials having a relatively large potential difference from a second pair of potential lines,
wherein said first and second logic gates have MIS transistors, and a well region in which an MIS transistor of said first logic gate is formed and a well region in which an MIS transistor of said second logic gate is formed are made common for each conduction type, and
wherein said first logic gate and said second logic gate each have two pairs of potential line portions, respectively including portions of said first pair of potential lines and portions of said second pair of potential lines, and further have a portion of at least one substrate potential line which supplies a substrate potential to said well regions.

8. A semiconductor integrated circuit according to claim 7, wherein said first logic gate includes an MIS transistor to which a substrate bias is applied in a reverse direction by a potential in said well region thereof, and said second logic gate includes an MIS transistor to which a substrate bias is applied in a forward direction by a potential in said well region thereof.

9. A semiconductor integrated circuit according to claim 7, wherein said first logic gate includes a p-channel type MIS transistor and an n-channel type MIS transistor to which substrate bias are applied in a reverse direction by respective potentials of the well regions thereof, and said second logic gate includes a p-channel type MIS transistor and an n-channel type MIS transistor to which substrate biases are applied in a forward direction by respective potentials of the well regions thereof.

10. A semiconductor integrated circuit according to claim 7, wherein said first logic gate includes a p-channel type MIS transistor to which a substrate bias is applied in a reverse direction by a potential of the well region thereof, and said second logic gate includes a p-channel type MIS transistor to which a substrate bias is applied in a forward direction by a potential in the well region thereof.

11. A semiconductor integrated circuit according to claim 7, wherein said first logic gate includes a p-channel type MIS transistor and an n-channel type MIS transistor to which substrate biases are applied in a reverse direction by respective potentials in the well regions thereof.

12. A semiconductor integrated circuit according to claim 7, wherein said first and second logic gates are supplied with said first and second potential pairs, respectively, as power sources in a standby mode.

13. A semiconductor integrated circuit comprising:
a first logic gate using, as an operation power source in an active operation mode, a first pair of potentials having a relatively small potential difference from a first pair of potential lines; and
a second logic gate using, as an operation power source in said active operation mode, a second pair of potentials having a relatively large potential difference from a second pair of potential lines,
wherein said first and second logic gates have MIS transistors, and a well region in which an MIS transistor of said first logic gate is formed and a well region in which an MIS transistor of said second logic gate is formed are electrically connected for each conduction type, and
wherein said first logic gate and said second logic gate each have two pairs of potential line portions, respectively including portions of said first pair of potential lines and portions of said second pair of potential lines, and further have a portion of at least one substrate potential line which supplies a substrate potential to said well regions.

14. A semiconductor integrated circuit according to claim 13, wherein said first logic gate includes an MIS transistor to which a substrate bias is applied in a reverse direction by a potential in the well region thereof, and said second logic gate includes an MIS transistor to which a substrate bias is applied in a forward direction by a potential in the well region thereof.

15. A semiconductor integrated circuit according to claim 13, wherein said first logic gate includes a p-channel type MIS transistor and an n-channel type MIS transistor to which substrate biases are applied in a reverse direction by respective potentials of the well regions thereof, and said second logic gate includes a p-channel type MIS transistor and an n-channel type MIS transistor to which substrate biases are applied in a forward direction by respective potentials of the well regions thereof.

16. A semiconductor integrated circuit according to claim 13, wherein said first logic gate includes a p-channel type MIS transistor to which a substrate bias is applied in a reverse direction by a potential of the well region thereof, and said second logic gate includes a p-channel type MIS transistor to which a substrate bias is applied in a forward direction by a potential in the well region thereof.

17. A semiconductor integrated circuit according to claim 13, wherein said first logic gate includes a p-channel type MIS transistor and an n-channel type MIS transistor to which substrate biases are applied in a reverse direction by respective potentials in the well regions thereof.

18. A semiconductor integrated circuit according to claim 13, wherein said first and second logic gates are supplied with said first and second potential pairs, respectively, as power sources in a standby mode.

19. A semiconductor integrated circuit comprising:
a first logic gate using, as an operation power source in an active operation mode, a first pair of a high potential and a low potential from a first pair of potential lines; and
a second logic gate using, as an operation power source in said active operation mode, a second pair of a high potential and a low potential having a potential difference larger than that of said first potential pair from a second pair of potential lines, wherein a substrate potential of an MIS transistor in said first logic gate and that of an MIS transistor in said second logic gate are common to each other, at least said first logic gate includes an MIS transistor to which a substrate bias is applied in a reverse direction by said substrate potential, and wherein said first logic gate and said second logic gate each have two pairs of potential line portions, respectively including portions of said first pair of potential lines and portion of said second pair of potential lines, and further have a portion of at least one substrate potential line which supplies said substrate potential.

20. A semiconductor integrated circuit according to claim 19, wherein said first potential pair includes a first high potential and a first low potential, said second potential pair includes a second high potential higher than said first high potential and a second low potential lower than said first low potential, and said substrate potential is one of a high potential side substrate potential between said first and second high potentials and is a low potential side substrate potential between said first and second low potentials.

21. A semiconductor integrated circuit according to claim 19, wherein said first potential pair includes a first high potential and a first low potential, said second potential pair includes a second high potential higher than the first high potential and a second low potential lower than said first low potential, said second high potential is used as a high potential side substrate potential, and said second low potential is used as a low potential side substrate potential.

22. A semiconductor integrated circuit according to claim 19, wherein said first potential pair includes a first high potential and a first low potential, said second potential pair includes a second high potential higher than the first high potential and said low potential, a potential between said first and second high potentials is used as a high potential side substrate potential, and a potential higher than said first low potential is used as a low potential side substrate potential.

23. A semiconductor integrated circuit according to claim 19, wherein said first and second logic gates are supplied with said first and second potential pairs, respectively, as power sources in a standby mode.

24. A semiconductor integrated circuit comprising:
a first logic gate connected to a first pair of a high potential line and a low potential line in an active operation mode; and
a second logic gate connected to a second pair of a high potential line and a low potential line in said active operation mode, said second pair of potential lines having a potential difference larger than that of said first pair of potential lines,
wherein a substrate potential line is commonly used for supplying a substrate potential to an MIS transistor of said first logic gate and for supplying a substrate potential to an MIS transistor of said second logic gate, and
wherein at least said first logic gate includes an MIS transistor to which a substrate bias is applied in a reverse direction by said substrate potential, and
wherein said first logic gate and said second logic gate each have two pairs of potential line portions, respectively including portions of said second pair of potential lines and portions of said second pair of potential lines, and further have a portion of at least one substrate potential line which supplies said substrate potential.

25. A semiconductor integrated circuit according to claim 24, wherein
said first pair of potential lines includes a first high potential line and a first low potential line,
said second pair of potential lines includes a second high potential line having a potential higher than that of said first high potential line and a second low potential line having a potential lower than said first low potential line, and
said substrate potential line is one of a high potential side substrate potential line having a potential between the potential of said first high potential line and the potential of said second high potential line, and a low potential side substrate potential line having a potential between the potential of said first low potential line and the potential of said second low potential line.

26. A semiconductor integrated circuit according to claim 24, wherein said first potential line pair includes a first high potential line and a first low potential line,
said second potential line pair includes a second high potential line having a potential higher than that of the first high potential line and a second low potential line having a potential lower than that of said first low potential, and
said second high potential line is used as a high potential side substrate potential line, and said second low potential line is used as a low potential side substrate potential line.

27. A semiconductor integrated circuit according to claim 24, wherein said first pair of potential lines includes a first high potential line and a first low potential line,
said second pair of potential lines includes said first low potential line and a second high potential line having a potential higher than that of the first high potential line, and
said substrate potential line is one of a high potential side substrate potential line having a potential between the potential of said first high potential line and the potential of the second high potential line, and a low potential side substrate potential line having a potential higher than the potential of said first low potential line.

28. A semiconductor integrated circuit according to claim 24, wherein said first and second logic gates are connected to said first and second pairs of potential lines, respectively, in a standby mode.

29. A semiconductor integrated circuit having a circuit region in which a number of logic gates each having an MIS transistor are arranged on a semiconductor substrate,
wherein said circuit region has a well region including portions shared by a substrate potential for each conduction type of MIS transistor,
a first logic gate using, as an operation power source in an active operation mode, a first pair of potentials having a relatively small potential difference from a first pair of potential lines and a second logic gate using, as an operation power source in said active operation mode, a second pair of potentials having a relatively large potential difference from a second pair of potential lines are formed in said well region,
in said well region, a p-type well region in which an n-channel type MIS transistor is formed and an n-type well portion in which a p-channel type MIS transistor is formed are adjacent to each other,
metal lines for supplying said first pair of potentials, said second pair of potentials, and a substrate potential are arranged on said well region, and wherein said first logic gate and second logic gate each have two pairs of potential line portions, respectively including portions of said first pair of potential lines and portions of said second pair of potential lines, and further have a portion of at least one substrate potential line which supplies said substrate potential.

30. A semiconductor integrated circuit according to claim 29, wherein said first logic gate includes an MIS transistor to which a substrate bias is applied in a reverse direction by said substrate potential, and
said second logic gate includes an MIS transistor to which a substrate bias is applied in a forward direction by said substrate potential.

31. A semiconductor integrated circuit according to claim 29, wherein said first logic gate includes a p-channel type MIS transistor and an n-channel type MIS transistor to which substrate biases are applied in a reverse direction by respective substrate potentials, and
said second logic gate includes a p-channel type MIS transistor and an n-channel type MIS transistor to which substrate biases are applied in a forward direction by the respective substrate potentials.

32. A semiconductor integrated circuit according to claim 29, wherein said first logic gate includes a p-channel type MIS transistor to which substrate bias is applied in a reverse direction by a substrate potential, and
said second logic gate includes a p-channel type MIS transistor to which a substrate bias is applied in a forward direction by said substrate potential.

33. A semiconductor integrated circuit according to claim 29, wherein said first logic gate includes a p-channel type MIS transistor and an n-channel type MIS transistor to which substrate biases are applied in a reverse direction by respective substrate potentials.

34. A semiconductor integrated circuit according to claim 29, wherein said first and second logic gates are supplied with said first and second potential pairs, respectively, as power sources in a standby mode.

35. A design data recording medium on which design data for forming an integrated circuit on a semiconductor chip is recorded so as to be readable by a computer, the design data comprising:
first mask pattern data for determining a figure pattern for forming a well region on which a plurality of logic gates is formed;
second mask pattern data for determining a figure pattern for forming a first pair of potential lines, a second pair of potential lines and a third pair of potential lines on said well region; and
third mask pattern data for determining a figure pattern for forming a plurality of connectors,
wherein a first group of said connectors connects said first pair of potential lines and portions of said well region,
wherein a second group of said connectors connects said second pair of potential lines and a first group of said logic gates for supplying a first potential difference to said first group of logic gates in an active operation mode,
wherein a third group of said connectors connects said third pair of potential lines and a second group of said logic gates for supplying a second potential difference which is larger than said first potential difference to said second group of logic gates in said active operation mode, and
wherein said second mask pattern includes a figure pattern for forming said first line pair and said second line pair in parallel in one row pattern.

36. A semiconductor integrated circuit according to claim 35, wherein said first and second groups of logic gates are supplied from said second and third pairs of potential lines, respectively, in a standby mode.

37. A design data recording medium according to claim 35,
wherein said well region includes a first well portion and a second well portion,
wherein said first mask pattern data includes fourth mask pattern data and fifth mask pattern data,
wherein said fourth mask pattern data is for determining a figure pattern for forming the first well portion, and
wherein said fifth mask pattern data is for determining a figure pattern for forming the second well portion.

38. A design data recording medium on which design data for designing an integrated circuit to be formed on a semiconductor chip is recorded so as to be readable by said computer, the design data comprises:
first function description data for determining a function of a first logic gate to which an operation power source is supplied, in an active operation mode, from a first pair of potential lines having a relatively small potential difference and a substrate potential is supplied from a substrate potential line; and
second function description data for determining a function of a second logic gate to which an operation power source is supplied, in said active operation mode, from a second pair of potential lines having a relatively large potential difference and a substrate potential is supplied from a substrate potential line connected to said substrate potential line,
wherein descriptions for the first logic gate and the second logic gate have description of said first line pair and said second line pair in common.

39. A semiconductor integrated circuit according to claim 38, wherein said first and second logic gates are supplied from said first and second potential pairs of potential lines, respectively, in a standby mode.

40. A semiconductor integrated circuit comprising:
a first logic gate which is supplied with a first potential difference as a sole operation power source from a first pair of potential lines; and
a second logic gate which is supplied with a second potential difference as a sole operation power source from a second pair of potential lines,
wherein said first potential difference is smaller than said second potential difference, and
wherein a substrate potential of MIS transistors is commonly used by said first and second logic gates, and
wherein said first logic gate and said second logic gate each have two pairs of potential line portions, respectively including portions of said first pair of potential lines and portions of said second pair of potential lines, and further have a portion of at least one substrate potential line which supplies said substrate potential.

41. A semiconductor integrated circuit comprising:
a first logic gate which is supplied with a first potential difference as a sole operation power source from a first pair of potential lines; and
a second logic gate which is supplied with a second potential difference as a sole operation power source from a second pair of potential lines,
wherein said first potential difference is smaller than said second potential difference, wherein said first and second logic gates have MIS transistors, and a well region in which an MIS transistor of said first logic gate is formed and a well region in which an MIS transistor of said second logic gate is formed are made common for each conduction type, and wherein said first logic gate and said second logic gate each have two pairs of potential line portions, respectively including portions of said first pair of potential lines and portions of said second pair of potential lines, and further have a portion of at least one substrate potential line which supplies a substrate potential to said well regions.

42. A semiconductor integrated circuit comprising:

a first logic gate which is supplied with a first potential difference as a sole operation power source from a first pair of potential lines; and a second logic gate which is supplied with a second potential difference as a sole operation power source from a second pair of potential lines, wherein said first potential difference is smaller than said second potential difference, wherein said first and second logic gates have MIS transistors, and a well region in which an MIS transistor of said first logic gate is formed and a well region in which an MIS transistor of said second logic gate is formed are electrically connected for each conduction type, and wherein said first logic gate and said second logic gate each have two pairs of potential line portions, respectively including portions of said first pair of potential lines and portions of said second pair of potential lines, and further have a portion of at least one substrate potential line which supplies a substrate potential to said well regions.

43. A semiconductor integrated circuit comprising:

a first logic gate which is supplied with a first potential difference as a sole operation power source from a first pair of potential lines of a high potential and a low potential; and a second logic gate which is supplied with a second potential difference as a sole operation power source from a second pair of potential lines of a high potential and a low potential, wherein said first potential difference is smaller than said second potential difference, wherein a substrate potential of MIS transistors in said first logic gate and that of an MIS transistor in said second logic gate are common to each other, wherein at least said first logic gate includes an MIS transistor to which a substrate bias is applied in a reverse direction by said substrate potential, and wherein said first logic gate and said second logic gate each have two pairs of potential line portions, respectively including portions of said first pair of potential lines and portions of said first pair of potential lines, and further have a portion of at least one substrate potential line which supplies said substrate potential.

44. A semiconductor integrated circuit comprising:

a first logic gate connected to receive a first potential difference as a sole operation power source from a first pair of potential lines of a high potential and a low potential; and a second logic gate connected to receive a second potential difference as a sole operation power source from a second pair of potential lines of a high potential and a low potential, wherein said first potential difference is smaller than said second potential difference, wherein a substrate potential line is commonly used for supplying a substrate potential to an MIS transistor of said first logic gate and for supplying a substrate potential to an MIS transistor of said second logic gate, wherein at least said first logic gate includes an MIS transistor to which a substrate bias is applied in a reverse direction by said substrate potential, and wherein said first logic gate and said second logic gate each have two pairs of potential line portions, respectively including portions of said first pair of potential lines and portions of said second pair of potential lines, and further have a portion of at least one substrate potential line which supplies said substrate potential.

45. A semiconductor integrated circuit having a circuit region in which a number of logic gates each having an MIS transistor are arranged on a semiconductor substrate, wherein said circuit region has a well region including portions shared by a substrate potential for each conduction type of MIS transistor, a first logic gate is supplied with a first potential difference as a sole operation power source from a first pair of potential lines, a second logic gate which is supplied with a second potential difference as a sole operation power source from a second pair of potential lines, said first logic gate and said second logic gate are formed in said well region, said first potential difference is smaller than said second, in said well region, a p-type well region in which an n-channel type MIS transistor is formed and an n-type well region in which a p-channel type MIS transistor is formed are adjacent to each other, metal lines for supplying said first potential difference, said second pair of potentials, and a substrate potential are arranged on said well region, and wherein said first logic gate and said second logic gate each have two pairs of potential line portions, respectively including portions of said first pair of potential lines and portions of said second pair of potential lines, and further have a portion of at least one substrate potential line which supplies said substrate potential.

46. A design data recording medium on which design data for forming an integrated circuit on a semiconductor chip is recorded so as to be readable by a computer, the design data comprising:

first mask pattern data for determining a figure pattern for forming a well region on which a plurality of logic gates is formed;

second mask pattern data for determining a figure pattern for forming a first pair of potential lines, a second pair of potential lines and a third pair of potential lines on said well region, and third mask pattern data for determining a figure pattern for forming a plurality of connectors, wherein a first group of said connectors connects said first pair of potential lines and portions of said well region, wherein a second group of said connectors connects said second pair of potential lines and a first group of said logic gates for supplying said first group of logic gates with a first potential difference as a sole operation power source from said second pair of potential lines, and wherein a third group of said connectors connects said third pair of potential lines and a second group of said logic gates for supplying said second group of logic gates with a second potential difference, which is larger than said first potential difference, as a sole operation power source from said third pair of potential lines, and wherein said second mask pattern includes a figure pattern for forming said first pair of potential lines and said second pair of potential lines in parallel in one row pattern.

47. A design data recording medium on which design data for designing an integrated circuit to be formed on a semiconductor chip is recorded so as to be read by said computer, the design data comprising:

first function description data for determining a function of a first logic gate which is supplied with a first potential difference as a sole operation power source from a first pair of potential lines and a substrate potential from a substrate potential line;

second function description data for determining a function of a second logic gate which is supplied with a second potential difference as a sole operation power source from a second pair of potential lines and a substrate potential from said substrate potential line; and third function description data for determining said first potential difference to be smaller than said second potential difference, wherein the descriptions of the first logic gate and the description of the second logic gate have the first pair of potential lines and the second pair of potential lines in common.

* * * * *